United States Patent
Ito et al.

(10) Patent No.: US 6,592,224 B2
(45) Date of Patent: Jul. 15, 2003

(54) OPTICAL REFLECTION POLARIZER AND PROJECTOR COMPRISING THE SAME

(75) Inventors: Yoshitaka Ito, Suwa (JP); Hidefumi Sakata, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/937,164

(22) PCT Filed: Jan. 9, 2001

(86) PCT No.: PCT/JP01/00051
§ 371 (c)(1),
(2), (4) Date: Nov. 7, 2001

(87) PCT Pub. No.: WO01/55778
PCT Pub. Date: Aug. 2, 2001

(65) Prior Publication Data
US 2003/0071972 A1 Apr. 17, 2003

(30) Foreign Application Priority Data
Jan. 28, 2000 (JP) ........................................ 2000-020818
Jul. 3, 2000 (JP) ........................................ 2000-201270

(51) Int. Cl.$^7$ .............................................. G03B 21/14
(52) U.S. Cl. .......................................... 353/20; 353/33
(58) Field of Search ........................ 353/20, 33; 349/5, 349/9; 359/256

(56) References Cited

U.S. PATENT DOCUMENTS

| | | | | |
|---|---|---|---|---|
| 4,560,999 A | * | 12/1985 | Tokuhara | 347/136 |
| 4,688,897 A | * | 8/1987 | Grinberg et al. | 349/113 |
| 5,138,474 A | * | 8/1992 | Arakawa | 349/120 |
| 5,157,526 A | * | 10/1992 | Kondo et al. | 349/6 |
| 5,283,600 A | * | 2/1994 | Imai | 349/9 |
| 5,381,278 A | * | 1/1995 | Shingaki et al. | 349/9 |
| 5,594,561 A | * | 1/1997 | Blanchard | 349/112 |
| 5,716,122 A | * | 2/1998 | Esaki et al. | 349/9 |
| 6,088,067 A | * | 7/2000 | Willett et al. | 349/117 |
| 6,224,215 B1 | * | 5/2001 | Maximus et al. | 349/5 |
| 6,257,726 B1 | * | 7/2001 | Okuyama | 353/20 |
| 6,310,671 B1 | * | 10/2001 | Larson | 349/86 |
| 6,390,626 B2 | * | 5/2002 | Knox | 349/9 |

OTHER PUBLICATIONS

Ohara Inc. High Transmission and Low Photoelastic Constant Glass. Available at: www.ohara–inc.co.jp/b/b02/b0205_pb/b0205.htm (Aug. 28, 2002).*

* cited by examiner

*Primary Examiner*—Russell Adams
*Assistant Examiner*—Michelle Nguyen
(74) *Attorney, Agent, or Firm*—Beyer Weaver & Thomas LLP

(57) ABSTRACT

The present invention provides a projector that stably displays high-contrast, bright images by improving light resistance and heat resistance of a polarizer. The projector includes: a light source device; an electro-optic device that modulates light emitted from the light source device; two polarizers that are disposed respectively on a light incoming side and a light outgoing side of the electro-optic device; and a projection optical system that projects light output from the electro-optic device. At least one of the two polarizers is a structural birefringent polarizing plate.

13 Claims, 16 Drawing Sheets

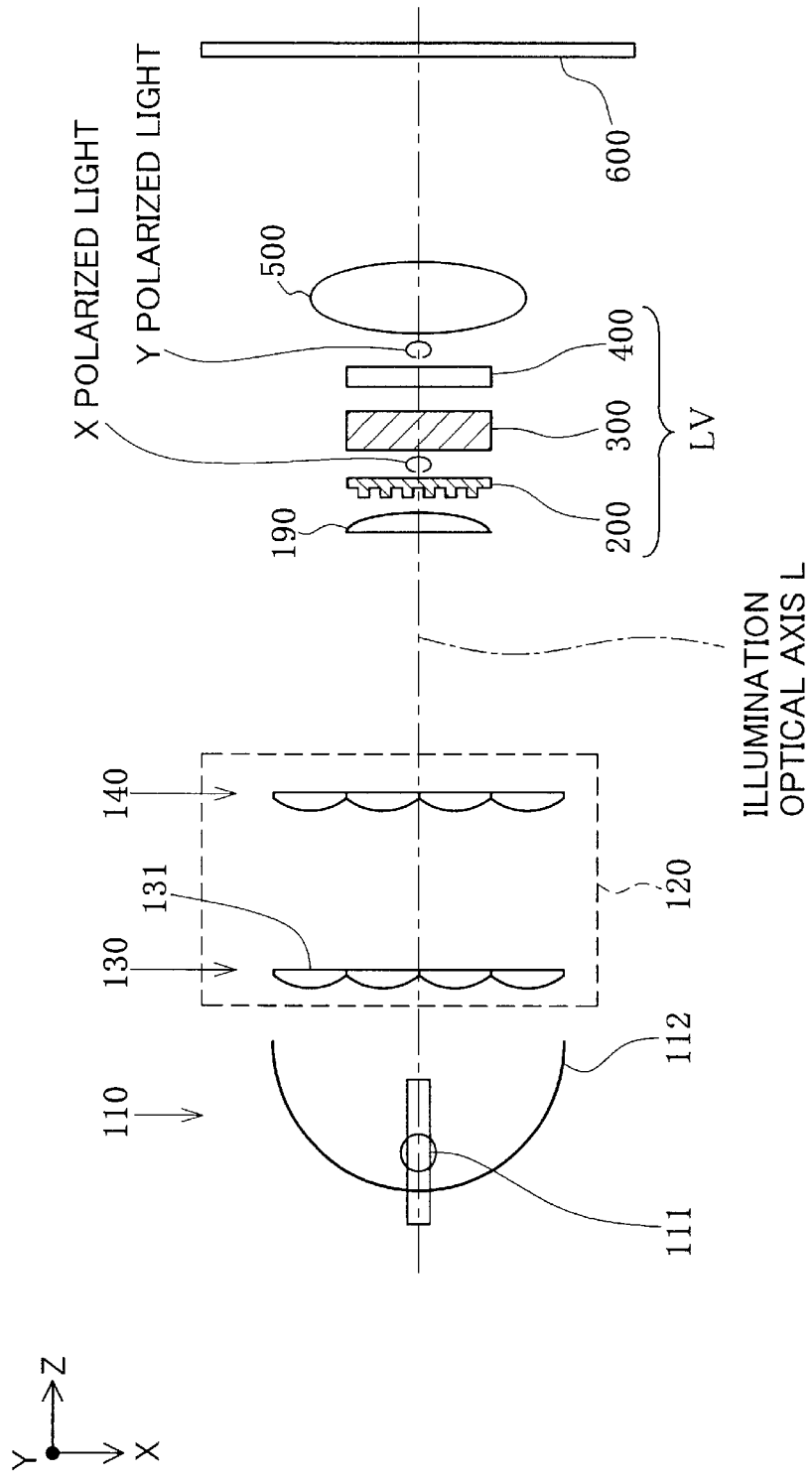

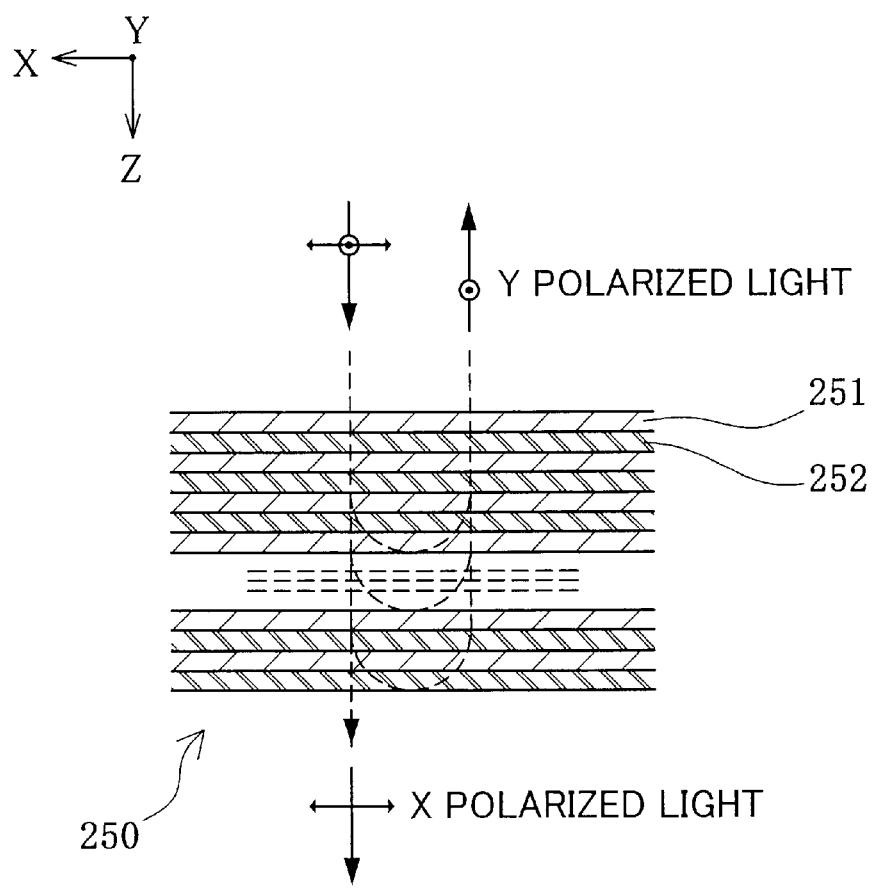

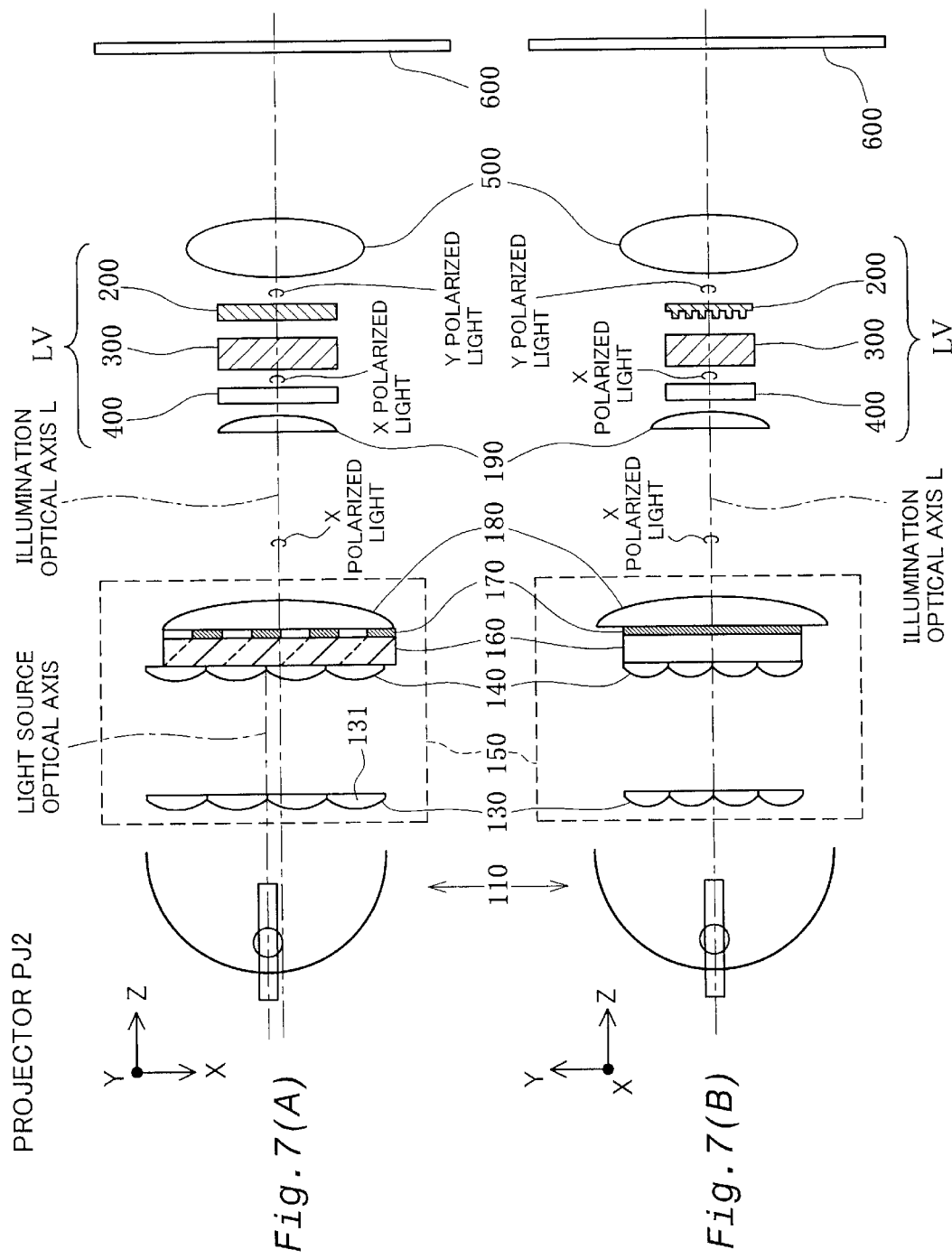

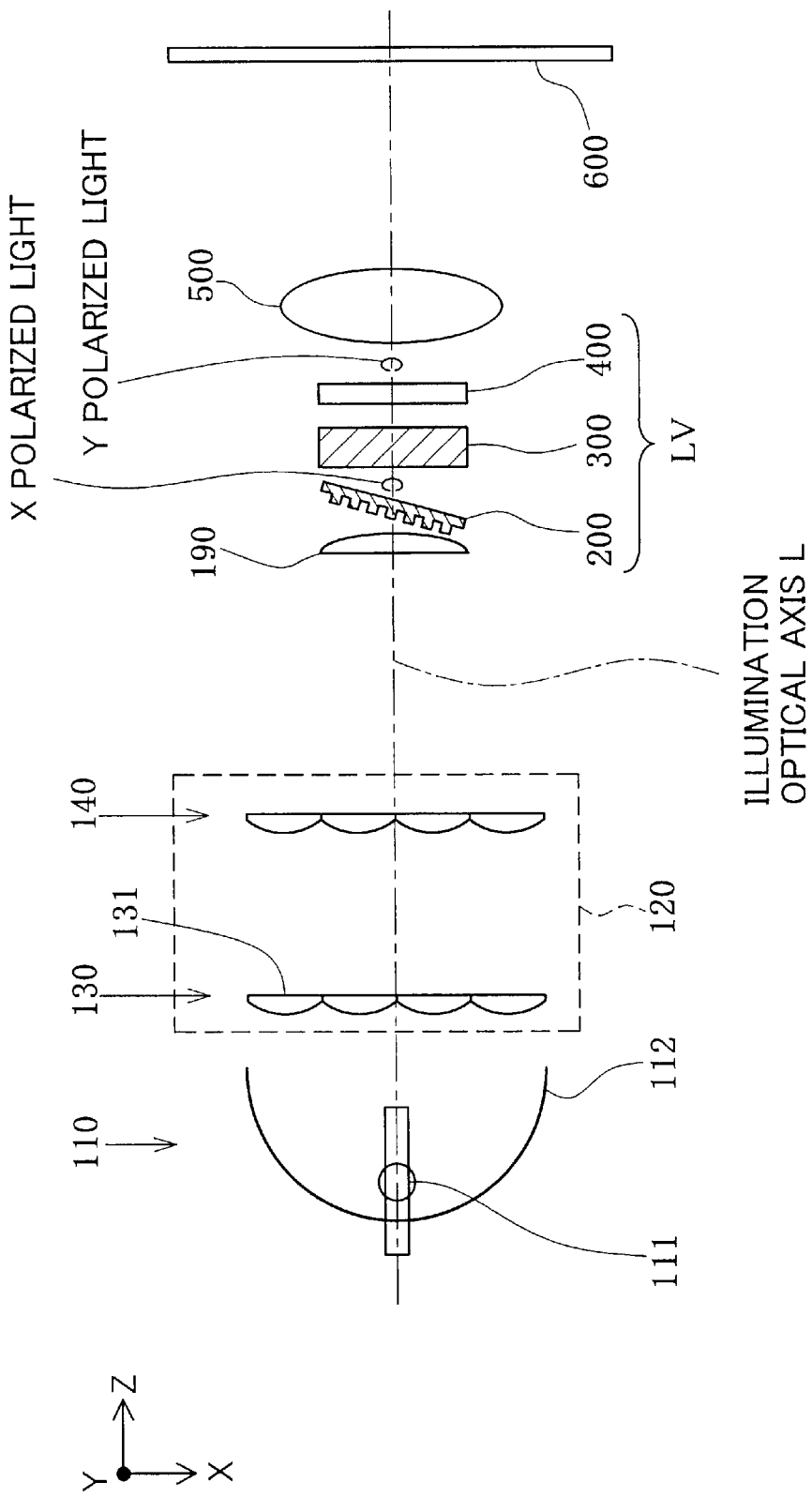

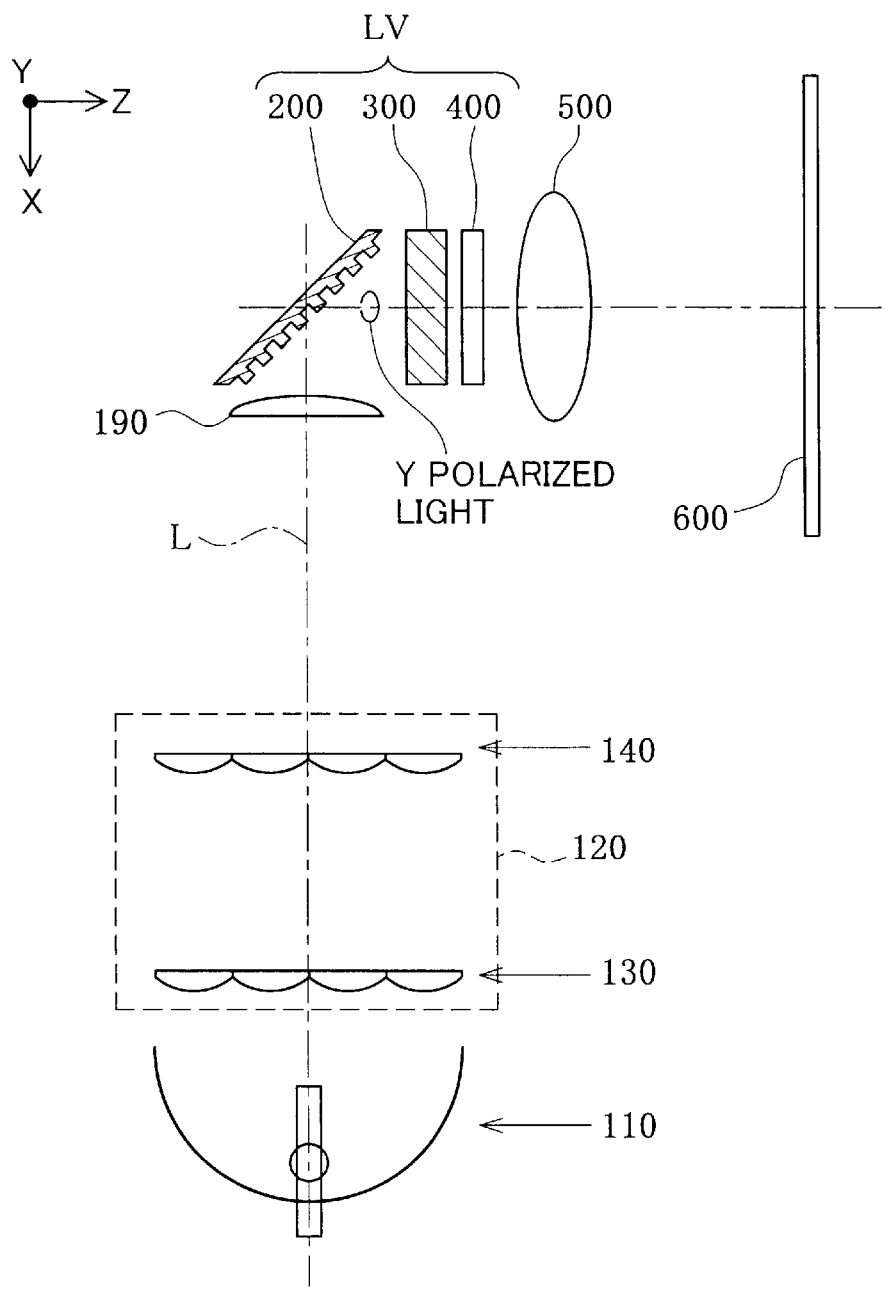

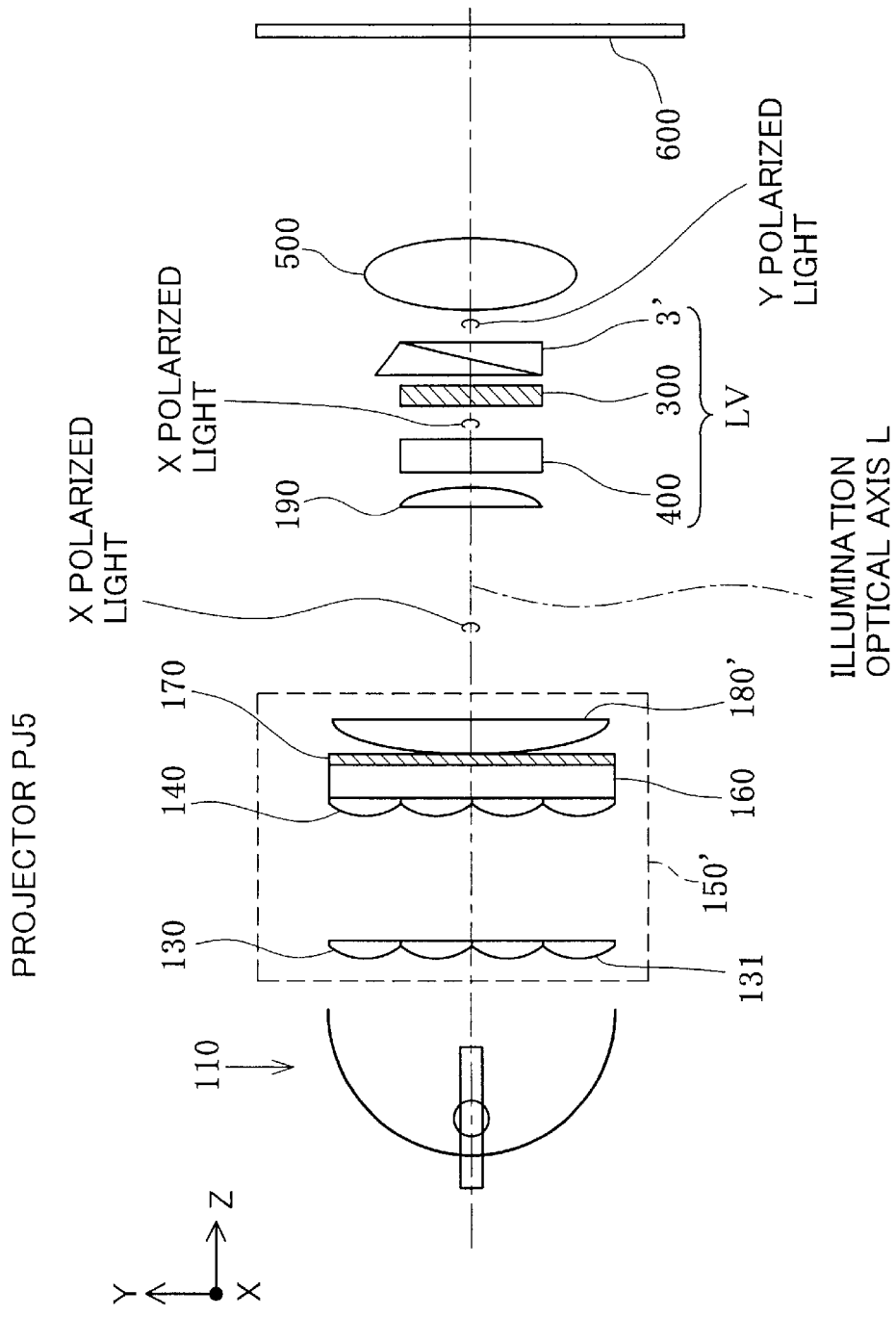

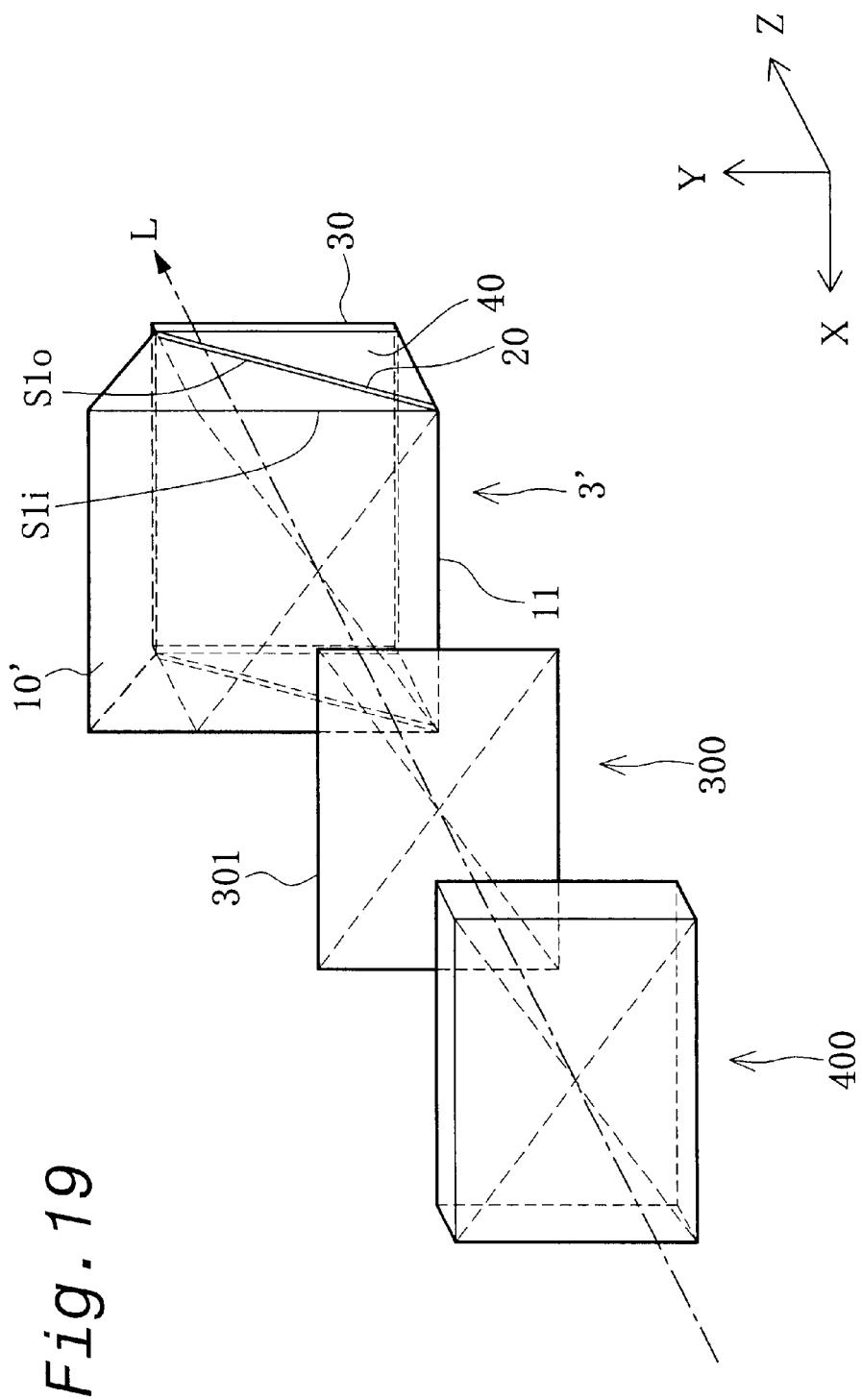

OPTICAL REFLECTION POLARIZER AND PROJECTOR COMPRISING THE SAME

TECHNICAL FIELD

The present invention relates to a projector for displaying images, and more specifically pertains to a polarizer that is disposed on a light-incoming side and/or a light-outgoing side of a liquid crystal device.

BACKGROUND ART

Projectors have a liquid crystal light valve including a liquid crystal device (a liquid crystal panel). Polarizers are generally disposed on a light incoming surface and a light outgoing surface of the liquid crystal device. The polarizer functions to transmit a predetermined polarized light component, while removing the other light components.

A light absorbing-type polarizing plate is generally used for the polarizer in the projector. A typical example of the light absorbing-type polarizing plate is obtained by uniaxially orienting a film including iodine or dye molecules. The light absorbing-type polarizing plate has a relatively high extinction rate and relatively small incident angle dependency but poor light resistance and heat resistance.

The recent demand for the enhanced brightness of projected images and the size reduction of the projector leads to higher output of the light source device and size reduction of the liquid,crystal device. This increases the luminous flux of light entering the polarizing plate and thereby raises the luminous flux density. Namely this raises the intensity of light entering the polarizing plate per unit area.

The raised intensity of light entering the polarizing plate per unit area undesirably increases thermal load applied to the polarizing plate. The light absorbing-type polarizing plate removes a non-required light component by absorption and converts the absorbed light component into heat. The light absorbing-type polarizing plate has poor light resistance and heat resistance and accordingly has difficulties in maintaining the polarization characteristics over a long time period. The disadvantage of the prior art projector is thus incapability of stably displaying high-contrast, bright images over a long time period.

DISCLOSURE OF THE INVENTION

The object of the present invention is thus to solve the drawbacks of the prior art technique discussed above and provide a projector that stably displays high-contrast, bright images by improving light resistance and heat resistance of a polarizer.

At least part of the above and the other related objects is attained by a projector as a first apparatus of the present invention. The projector includes: a light source device; an electro-optic device that modulates light emitted from the light source device; two polarizers that are disposed respectively on a light incoming side and a light outgoing side of the electro-optic device; and a projection optical system that projects light output from the electro-optic device. At least one of the two polarizers is a structural birefringent polarizing plate.

The structural birefringent polarizing plate may also be called a shape birefringent polarizing plate or a form birefringent polarizing plate.

This projector utilizes the structural birefringent polarizing plate, which hardly absorbs light and has relatively high light resistance and heat resistance. The projector thus stably displays high-contrast, bright images, even when the light entering the polarizer has a high intensity per unit area, due to an increase in light output of the light source device or due to reduction of the size of the electro-optic device.

When non-polarized light enters the polarizer disposed on the light incoming side of the electro-optic device, the thermal load applied to the polarizer on the light incoming side becomes heavier than the thermal load applied to the polarizer on the light outgoing side. In such cases, it is preferable that the structural birefringent polarizing plate is provided at least on the light incoming side of the electro-optic device.

When a predetermined polarized light enters the polarizer disposed on the light incoming side of the electro-optic device, the thermal load applied to the polarizer on the light outgoing side becomes heavier than the thermal load applied to the polarizer on the light incoming side. In such cases, it is preferable that the structural birefringent polarizing plate is provided at least on the light outgoing side of the electro-optic device.

In the above projector, the structural birefringent polarizing plate may be a wiregrid polarizing plate.

The wiregrid polarizing plate has a simple structure, which facilitates manufacture of the structural birefringent polarizing plate.

In accordance with one preferable application of the above projector, the structural birefringent polarizing plate includes a light transmissive crystal substrate and a fine periodic structure periodically formed in a predetermined direction on the light transmissive crystal substrate.

The light transmissive crystal substrate has a relatively high thermal conductivity and thus quickly releases heat generated by absorption of light by the structural birefringent polarizing plate. A sapphire substrate or a rock crystal substrate are typical examples; of the light transmissive crystal substrate.

In accordance with another preferable application of the above projector, the structural birefringent polarizing plate is inclined to a center axis of light illuminating the electro-optic device.

The inclined layout of the structural birefringent polarizing plate practically decreases the pitch of the fine periodic structure relative to the incident light, thus improving the optical characteristics of the structural birefringent polarizing plate.

In the above application, the structural birefringent polarizing plate may be arranged at an inclination of about 45 degrees relative to the center axis.

When the light transmitted through the structural birefringent polarizing plate is utilized for the electro-optic device, this arrangement causes a non-required light reflected by the structural birefringent polarizing plate to be emitted in the direction of about 90 degrees to the center axis. This arrangement prevents adverse effects of the non-required light on other optical elements. This arrangement further enables the light reflected by the structural birefringent polarizing plate to be utilized for the electro-optic device.

In accordance with still another preferable application of the above projector, the structural birefringent polarizing plate is divided into a plurality of areas, and at least one of the plurality of areas is inclined to a center axis of light illuminating the electro-optic device.

This arrangement relatively decreases the thickness of the inclined structural birefringent polarizing plate (that is, the dimension in the direction perpendicular to the light incoming surface of the electro-optic device). Part of the plurality of areas may be arranged perpendicular to the center axis of the light illuminating the electro-optic device (that is, parallel to the light incoming surface of the electro-optic device).

In the above application, at least one of the plurality of areas in the structural birefringent polarizing plate may be arranged at an inclination of about 45 degrees relative to the center axis.

When the light transmitted through the structural birefringent polarizing plate is utilized for the electro-optic device, this arrangement causes the light reflected by the structural birefringent polarizing plate to be emitted in the direction of about 90 degrees to the center axis. This effectively prevents adverse effects of the reflected light on other optical elements. For the effective use of the light reflected by the structural birefringent polarizing plate, the reflected light may be returned to the light source device for recycling.

In accordance with one preferable embodiment of the above projector, a light absorbing polarizing plate is further arranged on a light outgoing side of the structural birefringent polarizing plate.

The optical characteristics of the structural birefringent polarizing plate have relatively large incident angle dependency and wavelength dependency. The optical characteristics of the light absorbing polarizing plate, on the other hand, have relatively small incident angle dependency and wavelength dependency. The combined use of the light absorbing polarizing plate compensates for the incident angle dependency and the wavelength dependency of the structural birefringent polarizing plate, thus attaining the polarizer having excellent light resistance, heat resistance, and optical characteristics. The structural birefringent polarizing plate and the light absorbing polarizing plate may be optically integrated with each other. The optical integration reduces the loss of light occurring at their interface. A polarizing plate composed of an iodine or dye-containing material may be applied for the light absorbing polarizing plate.

In the projector of the above application, it is preferable that a light transmissive crystal substrate is further arranged on a light outgoing side of the light absorbing polarizing plate, and the light transmissive crystal substrate is appressed to the light absorbing polarizing plate.

The arrangement of the light absorbing polarizing plate in close contact with the light transmissive crystal substrate having a relatively large thermal conductivity facilitates release of the heat generated by absorption of light by the light absorbing polarizing plate. This arrangement thus relieves the deterioration of the optical characteristics of the structural birefringent polarizing plate and the light absorbing polarizing plate, due to the heat generated by the light absorbing polarizing plate.

In accordance with another preferable embodiment of the above projector, a light reflective polarizing plate is further arranged on a light outgoing side of the structural birefringent polarizing plate.

The light reflective polarizing plate may be a multi-layered polarizing plate that is obtained by alternatively laminating a birefringent film and non-birefringent film.

The combined use of the light reflective polarizing plate, instead of the light absorbing polarizing plate, effectively compensates for the incident angle dependency and the wavelength dependency of the structural birefringent polarizing plate, thus attaining the polarizer having excellent light resistance, heat resistance, and optical characteristics.

The present invention is further directed as its second apparatus to a projector including: a light source device; an electro-optic device that modulates light emitted from the light source device; two polarizers that are disposed respectively on a light incoming side and a light outgoing side of the electro-optic device; and a projection optical system that projects light output from the electro-optic device. At least one of the two polarizers includes: a first prism having a light incoming surface and a light outgoing surface, which face to each other in a non-parallel orientation; and a light reflective polarizing plate that is disposed on a side of the light outgoing surface of the first prism. The light reflective polarizing plate divides light emitted from the first prism into first and second polarized lights having different polarizing directions, and transmits the first: polarized light while reflecting the second polarized light. An angle defined by the light incoming surface and the light outgoing surface of the first prism is set to cause the second polarized light, which has been reflected by the light reflective polarizing plate and returned to the first prism, to be totally reflected by the light incoming surface.

This projector utilizes the light reflective polarizer including the light reflective polarizing plate. This polarizer hardly absorbs light and has relatively high light resistance and heat resistance. The projector thus stably displays high-contrast, bright images, even when the light entering the polarizer has a high intensity per unit area, due to an increase in light output of the light source device or due to reduction of the size of the electro-optic device.

This polarizer prevents the second, polarized light reflected by the light reflective polarizing plate from being emitted from the light incoming surface of the prism to the outside. The light reflective polarizer disposed on the light outgoing side of the electro-optic device in the projector causes no light from the light reflective polarizer to enter the light outgoing surface of the electro-optic device, thus desirably preventing malfunction of the electro-optic device.

This polarizer has a prism. The relatively small setting for the angle defined by the light incoming surface and the light outgoing surface of the prism reduces the size of the polarizer and thereby the total size of the projector.

In accordance with one preferable application of the above projector, the first prism has an intersection line defined by the light incoming surface and the light outgoing surface, and the intersection line is substantially parallel to longer sides of a rectangular display area on the electro-optic device.

This arrangement further reduces the size of the polarizer and thereby the total size of the projector.

In accordance with another preferable application of the above projector, a face of the first prism opposite to a vertical angle defined by the light incoming surface and the light outgoing surface of the first prism is set to cause the second polarized light totally reflected by the light incoming surface to enter the opposite face at substantially right angles.

This arrangement causes the light entering the opposite face to be mostly emitted from the opposite face, thus significantly decreasing the light that is reflected by the opposite face and re-enters the light reflective polarizing plate.

In the above projector, it is preferable that the first prism is composed of a material having a photoelastic constant of not higher than about 1 nm/cm/$10^5$ Pa.

The prism composed of a material having a relatively low photoelastic constant causes substantially no change in polarizing state of the light passing through the prism. The polarizer accordingly exerts the excellent optical characteristics.

In one preferable application, the projector further includes a second prism, which is disposed on a light outgoing side of the light reflective polarizing plate to receive the first polarized light transmitted through the light reflective polarizing plate.

The traveling direction of the light emitted from the polarizer is regulated by adequately setting the refractive index of the second prism and the angle defined by the light incoming surface and the light outgoing surface of the second prism. This enhances the degree of freedom in layout of other optical parts. Setting the shape and the refractive index of the second prism to be identical with those of the first prism gives the polarizer with substantially no change in traveling direction of the transmitted light.

In the above application, it is preferable that at least one of the first prism and the second prism is composed of a material having a photoelastic constant of not higher than about 1 nm/cm/$10^5$ Pa.

In the above application, it is also preferable that the second prism is arranged to make a travelling direction of the first polarized light emitted via the second prism substantially coincide with a travelling direction of light entering the first prism.

This arrangement makes the traveling direction of the light entering the polarizer substantially coincident with the traveling direction of the light emitted from the polarizer, thus readily constructing the optical system including other optical parts. The coincidence of the traveling directions is attained by setting the refractive index of the second prism practically equal to the refractive index of the first prism, by arranging the light incoming surface of the second prism substantially parallel to the light outgoing surface of the first prism, and by arranging the light outgoing surface of the second prism substantially parallel to the light incoming surface of the first prism.

In accordance with one preferable embodiment of the above projector, a light absorbing polarizing plate is disposed on a light outgoing side of the light reflective polarizing plate.

The light absorbing polarizing plate compensates for the incident angle dependency and the wavelength dependency of the light reflective polarizing plate, thus giving the polarizer having excellent light resistance, heat resistance, and optical characteristics. When the polarizer includes the second prism, the light absorbing polarizing plate may be disposed either on the light incoming side or on the light outgoing side of the second prism.

In the above projector, the light reflective polarizing plate may be a structural birefringent polarizing plate.

The structural birefringent polarizing plate is a light reflective polarizing plate that hardly absorbs light and has relatively high light resistance and heat resistance. The light reflective polarizer stably exerts the high optical characteristics even when the light entering the polarizer has a high intensity per unit area. A typical example of the structural birefringent polarizing plate is a wiregrid polarizing plate.

In one preferable example of the above arrangement, the structural birefringent polarizing plate has a fine periodic structure periodically formed along a predetermined direction, and the predetermined direction is substantially perpendicular to an intersection line defined by the light incoming surface and the light outgoing surface of the first prism.

This causes the structural birefringent polarizing plate to be inclined to the center axis of the light illuminating the electro-optic device. Such inclination practically decreases the pitch of the fine periodic structure relative to the incident light, thus improving the optical characteristics of the structural birefringent polarizing plate.

In the above projector, the light reflective polarizing plate may be a multi-layered polarizing plate that is obtained by alternatively laminating a birefringent film and non-birefringent film.

Application of the multi-layered polarizing plate for the light reflective polarizing plate relatively reduces the incident angle dependency and the wavelength dependency.

The present invention is also directed its third apparatus to a projector including: a light source device; an electro-optic device that modulates light emitted from the light source device; two polarizers that are disposed respectively on a light incoming side and a light outgoing side of the electro-optic device; and a projection optical system that projects light output from the electro-optic device. At least one of the two polarizers includes a plurality of polarizer elements. Each polarizer element has: a first prism having a light incoming surface and a light outgoing surface, which face to each other in a non-parallel orientation; and a light reflective polarizing plate that is disposed on a side of the light outgoing surface of the first prism. The plurality of polarizer elements are jointed in such a manner that the respective light incoming surfaces of the first prisms are located in a virtually same plane. In each polarizer element, the light reflective polarizing plate divides light emitted from the first prism into first and second polarized lights having different polarizing directions, and transmits the first polarized light while reflecting the second polarized light. An angle defined by the light incoming surface and the light outgoing surface of the first prism is set to cause the second polarized light, which has been reflected by the light reflective polarizing plate and returned to the first prism, to be totally reflected by the light incoming surface.

The polarizer included in the second apparatus discussed above is used for the polarizer elements, so that this projector exerts the same functions and advantages as those of the projector of the second apparatus. Compared with the second apparatus using an integral polarizer, this arrangement decreases the thickness of each polarizer element and thereby reduces the total size of the polarizer. Application of the polarizer having the above construction to the projector advantageously reduces the whole size of the projector, compared with the projector of the second apparatus.

The present invention is also directed as its fourth apparatus to a polarizer including: a first prism having a light incoming surface and a light outgoing surface, which face to each other in a non-parallel orientation; and a light reflective polarizing plate that is disposed on a side of the light outgoing surface of the first prism. The light reflective polarizing plate divides light emitted from the first prism into first and second polarized lights having different polarizing directions, and transmits the first polarized light while reflecting the second polarized light. An angle defined by the light incoming surface and the light outgoing surface of the first prism is set to cause the second polarized light, which has been reflected by the light reflective polarizing plate and returned to the first prism, to be totally reflected by the light incoming surface.

This polarizer is same with the polarizer used in the second apparatus of the present invention and accordingly exerts the same functions and advantages.

The present invention is further directed as its fifth apparatus to a polarizer that includes a plurality of polarizer elements. Each polarizer element has: a first prism having a light incoming surface and a light outgoing surface, which face to each other in a non-parallel orientation; and a light reflective polarizing plate that is disposed on a side of the light outgoing surface of the first prism. The plurality of polarizer elements are jointed in such a manner that the respective light incoming surfaces of the first prisms are located in a virtually same plane. In each polarizer element, the light reflective polarizing plate divides light emitted from the first prism into first and second polarized lights having different polarizing directions, and transmits the first polarized light while reflecting the second polarized light. An angle defined by the light incoming surface and the light outgoing surface of the first prism is set to cause the second polarized light, which has been reflected by the light reflective polarizing plate and returned to the first prism, to be totally reflected by the light incoming surface.

This polarizer is same with the polarizer used in the third apparatus of the present invention and accordingly exerts the same functions and advantages.

BRIEF DESCRIPTION OF THE DRAWINGS

FIG. 1 is a plan view schematically illustrating the structure of a main part of a projector PJ1 in a first embodiment;

FIG. 6 is a sectional view showing the structure of the light reflective polarizing plate 250 of FIG. 5;

FIGS. 7(A) and 7(B) are plan views schematically illustrating the structure of a main part of a projector PJ2 in a second embodiment;

FIG. 8 is a plan view schematically illustrating the structure of a main part of a projector PJ3 in a third embodiment;

FIG. 10 is a plan view schematically illustrating the structure of a main part of a projector PJ4 in a fourth embodiment;

FIG. 18 is a plan view schematically illustrating the structure of a main part of a projector PJ5 in the fifth embodiment; and FIG. 19 shows layout of the light reflective polarizer 3' disposed on the light outgoing side of the liquid crystal device 300 of FIG. 18.

BEST MODES OF CARRYING OUT THE INVENTION

Figure 2A:
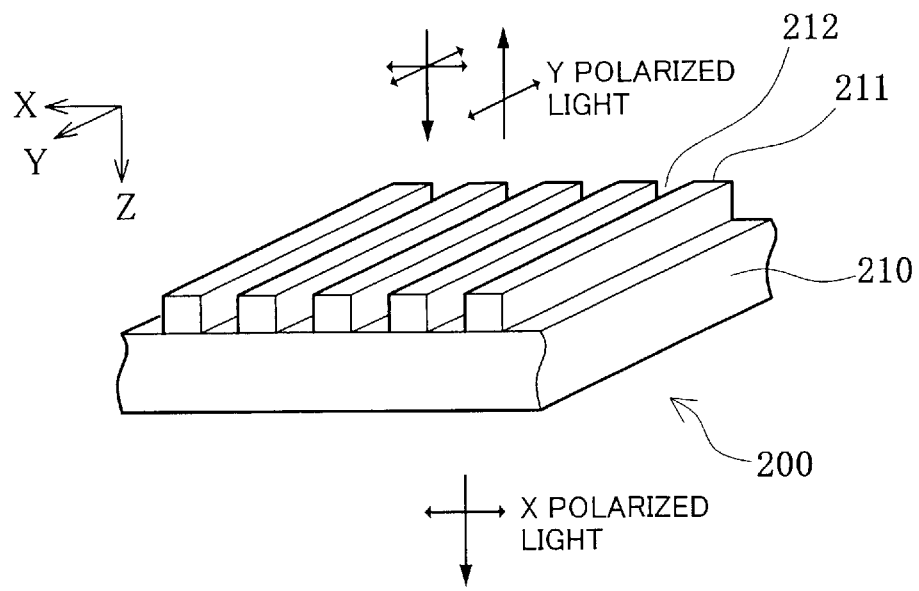
FIGS. 2(A) and 2(B) illustrate some examples of the structural birefringent polarizing plate 200 shown in FIG. 1.

Some modes of carrying out the present invention are discussed below with referring to drawings. In the drawings, X, Y, and Z directions represent three different directions perpendicular to one another. In the description hereafter, light polarized in the X direction is referred to as X polarized light, while light polarized in the Y direction is referred to as Y polarized light.

A. First Embodiment

FIG. 1 is a plan view schematically illustrating the structure of a main part of a projector PJ1 in a first embodiment. The projector PJ1 has a light source device 110, an integrator optical system 120, a parallelizing lens 190, a liquid crystal light valve LV, and a projection optical system 500. The liquid crystal light valve LV includes a liquid crystal device 300 that corresponds to the electro-optic device of the present invention, and two polarizers 200 and 400 that are disposed respectively on a light incoming side and a light outgoing side of the liquid crystal device 300. As discussed later, in this embodiment, a structural birefringent polarizing plate, which is one type of light reflective polarizing plates, is applied for the polarizer 200 on the light incoming side, whereas a light absorbing polarizing plate is applied for the polarizer 400 on the light outgoing side.

The light reflective polarizing plate represents a polarizing plate that reflects a non-transmitted component of polarized light, whereas the light absorbing polarizing plate represents a polarizing plate that absorbs the non-transmitted component of polarized light.

The light source device 110 includes a light source lamp 111 and a reflector 112. Non-polarized light emitted radially from the light source lamp 111 is reflected by the reflector 112, so that substantially parallel light is emitted from the light source device 110 along an illumination optical axis The integrator optical system 120 includes two lens arrays 130 and 140. A plurality of small lenses 131 having a rectangular shape, which is substantially similar to the shape of a display area of the liquid crystal device 300, are arranged in a matrix on each of the lens arrays 130 and 140. The bundle of rays entering the first lens array 130 is divided into a plurality of partial bundles by the respective small lenses 131 and superimposed on the liquid crystal device 300 by the function of the second lens array 140. The integrator optical system 120 thus equalizes an in-plane intensity distribution of the light emitted from the light source device 110 and illuminates the liquid crystal device 300 with the light. The light emitted from the integrator optical system 120 enters the structural birefringent polarizing plate 200 via the parallelizing lens 190.

The structural birefringent polarizing plate 200 converts the non-polarized light emitted from the integrator optical system 120 to a substantially one type of polarized light. The non-polarized light may be regarded as a composite light of two different linearly polarized lights having perpendicular polarizing directions. The structural birefringent polarizing plate 200 reflects one linearly polarized light, while transmitting the other linearly polarized light, so as to convert the non-polarized light emitted from the light source device 110 to substantially one type of linearly polarized light. In this embodiment, the structural birefringent polarizing plate 200 transmits the X polarized light, which has been polarized in the X direction.

The liquid crystal device 300 is a transmissive-type liquid crystal panel that modulates incident polarized light and emits the modulated polarized light. More specifically, the X polarized light entering the liquid crystal device 300 is modulated, based on image information given from external circuit (not shown), and the modulated light including a Y polarized light component is emitted from the liquid crystal device 300.

The light absorbing polarizing plate 400 eliminates a non-required component from the modulated light emitted from the liquid crystal device 300 to create light representing an image. More specifically, the light absorbing polarizing plate 400 is arranged to make the direction of its transmission axis coincident with the Y direction. The light absorbing polarizing plate 400 absorbs a non-required X polarized light component from the modulated light emitted from the liquid crystal device 300 and transmits the Y polarized light component, thereby producing the image light. A uniaxial oriented polarizing plate composed of iodine or dye molecules having a high extinction rate may be applied for the light absorbing polarizing plate 400.

The projection optical system 500 projects the image light produced by the light absorbing polarizing plate 400 onto a projection screen 600. An image is accordingly displayed on the projection screen 600.

Figure 2B:
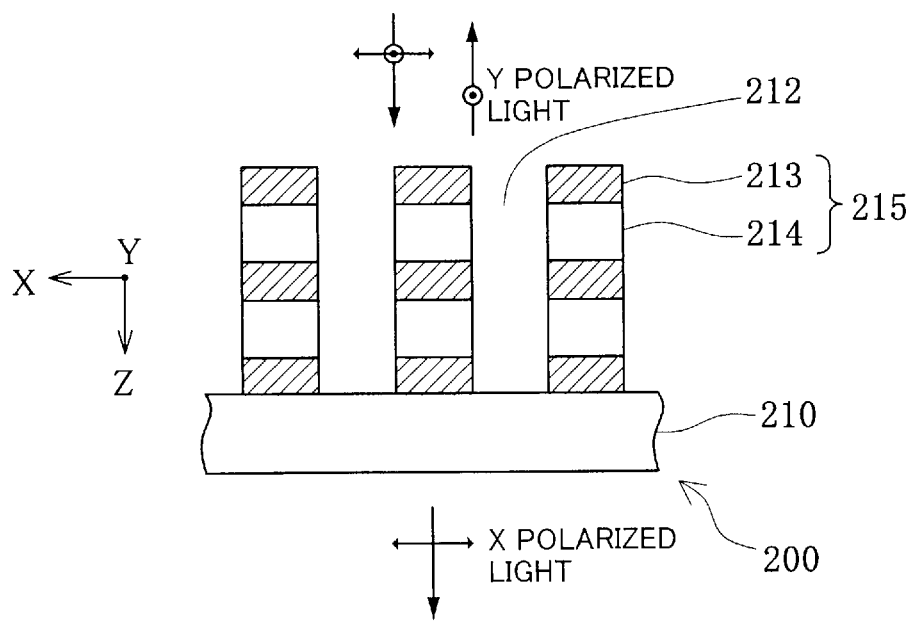

FIGS. 2(A) and 2(B) illustrate some examples of the structural birefringent polarizing plate 200 shown in FIG. 1. The structural birefringent polarizing plate 200 is a polarizing plate having a fine periodic structure periodically formed in a predetermined direction (in the X direction). The element pitch in the fine periodic structure is set to be shorter than the wavelength of the incident light. Adequate selection of the material of the fine periodic structure and regulation of the pitch give a desired refractive index distribution and desired optical anisotropy, thus attaining desired polarization characteristics.

FIG. 2(A) is a perspective view schematically illustrating a wiregrid-type structural birefringent polarizing plate 200. The wiregrid polarizing plate 200 has a structure made by depositing a metal thin film 211 on a light transmissive substrate 210 and forming fine grooves 212 extending in the Y direction that separate the metal thin film 211. The metal fine periodic structure 211 reflects light in a wavelength range to be polarized. The metal thin film 211 may be composed of aluminum or tungsten and is formed by vapor deposition or by sputtering. The fine grooves 212 may be formed by a combination of etching with two-beam interference exposure, electron beam lithography, or X-ray lithography. The wiregrid-type structural birefringent polarizing plate 200 has a simple structure and is thus readily manufactured.

FIG. 2(B) is a sectional view illustrating another example of the structural birefringent polarizing plate 200. This structural birefringent polarizing plate 200 has a structure made by depositing a multi-layered film 215 on a light transmissive substrate 210 and forming fine grooves 212 extending in the Y direction that separate the multi-layered film 215. The multi-layered film 215 is obtained by alternately laminating two different dielectric thin films 213 and 214, which are isotropic but have different refractive indexes. The multi-layered film 215 and the grooves 212 are formed in the same manner as the metal thin film 211 and the grooves 212 of FIG. 2(A).

Non-polarized light entering the structural birefringent polarizing plate 200 having the structure as shown in: FIG. 2(A) or FIG. 2(B) is divided into a Y polarized light component, whose direction of polarization Y is the same as the direction in which the fine grooves 212 extend, and an X polarized light component, which is perpendicular to the Y direction. The X polarized light is transmitted through the structural birefringent polarizing plate 200, whereas the Y polarized light is reflected by the structural birefringent polarizing plate 200. Namely the structural birefringent polarizing plate 200 functions as the light reflective polarizing plate that reflects the non-transmitted polarized light. The structural birefringent polarizing plate 200 has very little light absorption in principle.

In actual use of the structural birefringent polarizing plate 200, however, the fine periodic structure 211 slightly absorbs light and generates heat. In order to relieve the temperature rise in the structural birefringent polarizing plate 200, a light transmissive crystal substrate having a high thermal conductivity is desirably used for the light transmissive substrate 210. Such application ensures rapid and homogeneous dissipation of heat generated by the fine periodic structure 211, and thereby gives the thermally stable structural birefringent polarizing plate 200.

The preferable material for the light transmissive crystal substrate has relatively high thermal conductivity and light transmittance. For example, a sapphire substrate mainly composed of alumina (aluminum oxide) or a rock crystal substrate may be applied for the light transmissive crystal substrate. The sapphire substrate has the thermal conductivity of about 50 times the thermal conductivity of a standard glass substrate and about 35 times the thermal conductivity of a quartz glass substrate.

The structural birefringent polarizing plate 200 may also be obtained by orienting fine particles or fine crystals with shape anisotropy or by forming a thin film (for example, an alumina) with pores according to the anodic oxidation method.

In principle, the polarization separation characteristics of the structural birefringent polarizing plate have incident angle dependency and wavelength dependency. These dependencies are reduced by making the pitch of the fine periodic structure sufficiently small relative to the wavelength of incident light. However, there is a manufactural limit to make the periodic structure finer. Especially for the light in a shorter wavelength domain, the dependencies may thus not be reduced sufficiently. The combined use of another polarizing plate preferably compensates for the polarization separation characteristics of the structural birefringent polarizing plate as discussed below.

Figure 3:
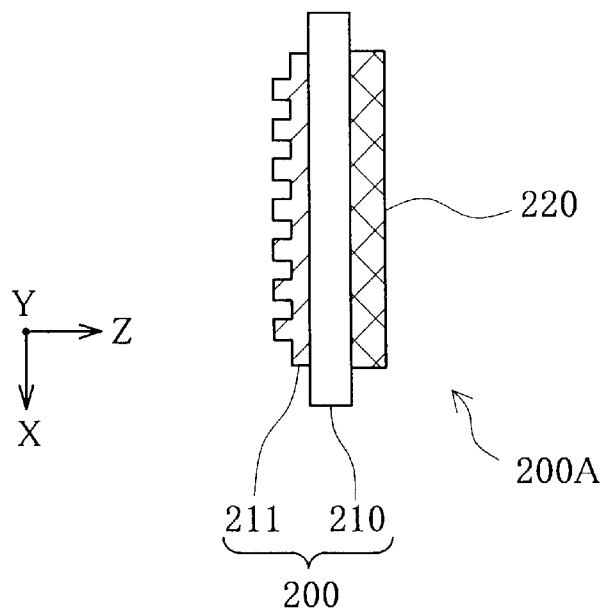
FIG. 3 is a sectional view schematically illustrating a structural birefringent polarizing plate 200A integrated a light absorbing polarizing plate.

FIG. 3 is a sectional view schematically illustrating a structural birefringent polarizing plate 200A integrated a light absorbing polarizing plate. This structural birefringent polarizing plate 200A has two different polarizing plates, that is, the structural birefringent polarizing plate 200 shown in FIG. 2(A) and a light absorbing polarizing plate 220 disposed on the light outgoing side of the structural birefringent polarizing plate 200. The light absorbing polarizing plate 220 is supported on a light transmissive substrate 210, which is arranged on the light outgoing surface of the structural birefringent polarizing plate 200, to be in close contact with the light transmissive substrate 210. The light absorbing polarizing plate 220 is arranged to make the direction of its transmission axis coincident with the direction of the transmission axis of the structural birefringent polarizing plate 200 (that is, the X direction). A uniaxial oriented polarizing plate composed of iodine or dye molecules may be applied for the light absorbing polarizing plate 220. Such light absorbing polarizing plates are mass produced and inexpensive.

In the structural birefringent polarizing plate 200A, the two polarizing plates, that is, the structural birefringent polarizing plate 200 and the light absorbing polarizing plate 220, are optically integrated with each other. The structural birefringent polarizing plate 200 that hardly absorbs light and has excellent light resistance and heat resistance is disposed on the light incoming side, whereas the light absorbing polarizing plate 220 that has excellent polarization characteristics and relatively small incident angle dependency and wavelength dependency is disposed on the light outgoing side. The combined use of the light absorbing polarizing plate desirably compensates for the incident angle dependency and the wavelength dependency of the polarization separation characteristics in the structural birefringent polarizing plate.

The above layout of the two polarizing plates relatively decreases heat generation by the light absorbing polarizing plate 220, while improving the polarization characteristics of the structural birefringent polarizing plate 200A.

Figure 4:
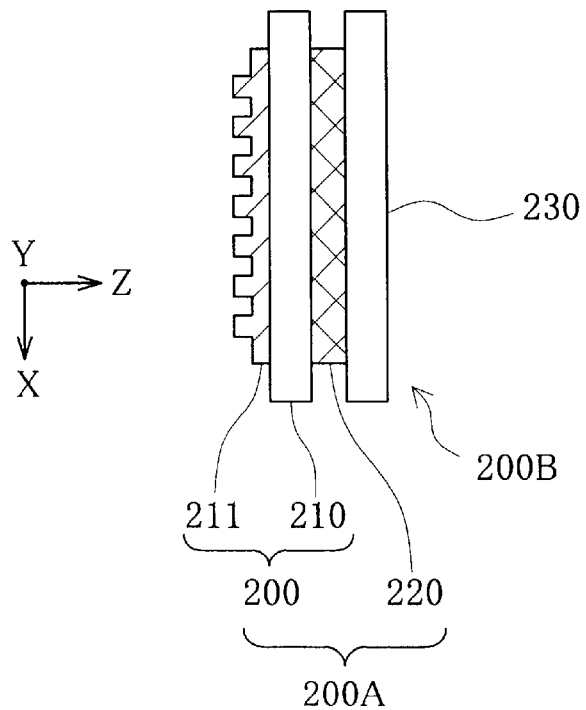
FIG. 4 is a sectional view schematically illustrating another structural birefringent polarizing plate 200B integrated with a light absorbing polarizing plate.

FIG. 4 is a sectional view schematically illustrating another structural birefringent polarizing plate 200B integrated with a light absorbing polarizing plate. The structural birefringent polarizing plate 200B includes a light transmissive crystal substrate 230, which is disposed on the light outgoing side of the structural birefringent polarizing plate 200A of FIG. 3.

In the structural birefringent polarizing plate 200A, the light absorbing polarizing plate 220 slightly absorbs light. This may cause heat distortion inside the light absorbing polarizing plate 220, which leads to local variation in polarization characteristics. Arrangement of the light transmissive crystal substrate 230 having a relatively high thermal conductivity to be in close contact with the light absorbing polarizing plate 220 as shown in FIG. 4 relieves the temperature rise in the light absorbing polarizing plate 220. The structural birefringent polarizing plate 200B accordingly has excellent polarization characteristics.

The preferable material for the light transmissive crystal substrate 230 has relatively high thermal conductivity and light transmittance. For example, a sapphire substrate mainly composed of alumina or a rock crystal substrate may be applied for the light transmissive crystal substrate 230. The light absorbing polarizing plate 220 and the light transmissive crystal substrate 230 may be fixed and adhere to each other, for example, via an adhesive.

In the structure of FIG. 4, the light absorbing polarizing plate 220 is interposed between the light transmissive substrate 210 and the light transmissive crystal substrate 230. This structure homogeneously and evenly dissipates the heat generated by the light absorbing polarizing plate 220. Thus, this structure effectively relieving the temperature rise of the structural birefringent polarizing plate, due to the heat generation in the light absorbing polarizing plate 220.

The structural birefringent polarizing plates 200A and 200B shown in FIGS. 3 and 4 relieve the incident angle dependency and the wavelength dependency of the structural birefringent polarizing plate 200 and attain the excellent polarization characteristics. These polarizing plates 200A and 200B are especially effective for illuminating systems using light of large divergence and illuminating systems using light in a short wavelength domain.

Figure 5:
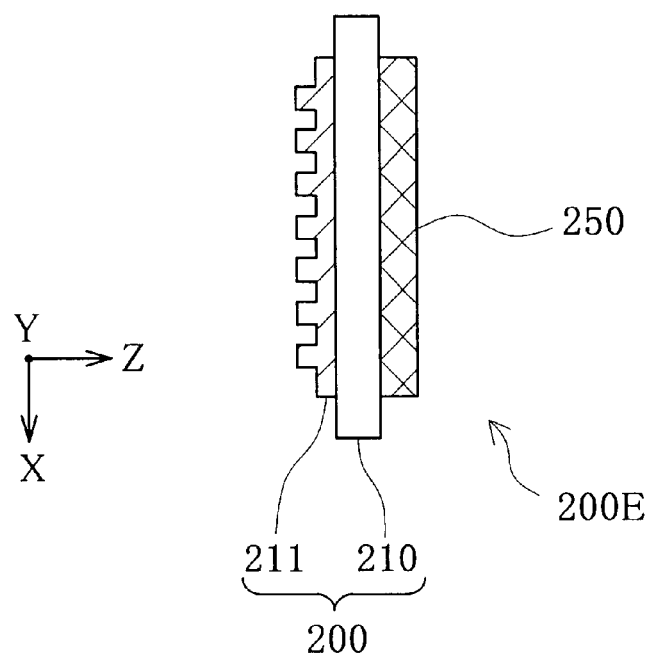
FIG. 5 is a sectional view schematically illustrating still another structural birefringent polarizing plate 200E integrated with a light reflective polarizing plate.

FIG. 5 is a sectional view schematically illustrating still another structural birefringent polarizing plate 200E integrated with a light reflective polarizing plate. The structural birefringent polarizing plate 200E has a similar structure to that of the structural birefringent polarizing plate 200A shown in FIG. 3, except that the light absorbing polarizing plate 220 is replaced by a light reflective polarizing plate 250. The light reflective polarizing plate 250 is disposed to be in close contact with the light transmissive substrate 210, which supports the structural birefringent polarizing plate 200E, and is optically integrated. The light reflective. polarizing plate 250 is arranged to make the direction of its transmission axis coincident with the direction of the transmission axis of the structural birefringent polarizing plate 200 (that is, the X direction).

FIG. 6 is a sectional view showing the structure of the light reflective polarizing plate 250 of FIG. 5. The light reflective polarizing plate 250 is a multi-layered polarizing plate obtained by alternately laminating a first film 251 with birefringence and a second film 252 without birefringence. The materials of the first film 251 and the second film 252 are selected in advance to satisfy relations of n1X≈n2 and n1Y≠n2, where n1X and n1Y denote refractive indexes of the first film 251 in the X direction and in the Y direction, and n2 denotes a refractive index of the isotropic second film 252.

The refractive indexes in the X direction at an interface between the first film 251 and the second film 252 are practically equal to each other, so that the polarized light in the X direction is transmitted without interference reflection. However, the refractive indexes in the Y direction at the interface are different from each other, so that part of the polarized light in the Y direction is subjected to interference reflection. The wavelength of the reflected light depends upon the refractive indexes and the thicknesses of the two films 251 and 252. The reflectance depends upon the number of layers in the laminate and the birefringence of the first film 251.

The adequate settings for the thicknesses and the refractive indexes (materials) of the films 251 and 252 and the number of layers in the laminate give the light reflective polarizing plate 250, which transmits substantially all the incident X polarized light while reflecting substantially all the incident Y polarized light. Such a light reflective polarizing plate is described in detail, for example, in JAPANESE PATENT LAID-OPEN GAZETTE No. 9-506985 based on International Application.

Instead of the multi-layered polarizing plate discussed above, an optical element including a cholesteric liquid crystal in combination with a λ/4 retardation plate, an optical element utilizing the Brewster angle for separation into a reflecting polarized light and a transmitting polarized light (for example, SID'92 DIGEST p427), or a hologram optical element taking advantage of hologram may be applied for the light reflective polarizing plate 250.

In the structural birefringent polarizing plate 200E (FIG. 5), the light reflective polarizing plate 250 is disposed on the light outgoing side of the structural birefringent polarizing plate 200. This arrangement prevents heat generation due to the light absorption. The light reflective polarizing plate 250 replacing the light absorbing polarizing plate 220 of FIG. 3 also effectively compensates for the incident angle dependency and the wavelength dependency of the polarization separation characteristics in the structural birefringent polarizing plate.

Any of the structural birefringent polarizing plates 200A, 200B, and 200E may be disposed on the light incoming side of the liquid crystal device 300, in place of the structural birefringent polarizing plate 200 shown in FIG. 1.

In the structural birefringent polarizing plates 200A, 200B, and 200E, the structural birefringent polarizing plate 200 is optically integrated with either the light absorbing polarizing plate 220 or the light reflective polarizing plate 250. The two polarizing plates may alternatively be separated from each other. The integration, however, reduces the loss of light occurring at the interface between the two polarizing plates, thus enhancing the utilization efficiency of light.

As described above, in the projector PJ1, the structural birefringent polarizing plate 200 (200A, 200B, 200E) that hardly absorbs light is disposed on the light incoming side of the liquid crystal device 300. Such arrangement desirably reduces the heat generation in the polarizer and thus maintains the characteristics of the polarizer over a long time period, even when the light entering the polarizer has a high intensity per unit area, due to application of a light source device having a greater light output or due to application of a liquid crystal device having a smaller display area. This actualizes a projector that stably displays high-contrast, bright images.

The little heat generation in the polarizer may reduce the size of a cooling device, which is generally used in the conventional system, or even omit the cooling device, thus advantageously reducing the noise and the whose size of the projector.

In the projector PJ1 of FIG. 1, the structural birefringent polarizing plate 200 is disposed on the light incoming side of the liquid crystal device 300. This is because the non-polarized light is used as illumination light in the projector PJ1 and thereby a greater thermal load is applied to the polarizer 200 disposed on the light incoming side of the liquid crystal device 300, compared with the polarizer 400 disposed on the light outgoing side. In the projector utilizing non-polarized light as illumination light, it is effective to arrange a structural birefringent polarizing plate having high light resistance and heat resistance on the light incoming side of the liquid crystal device. The structural birefringent polarizing plate 200 may also be disposed on the light outgoing side of the liquid crystal device 300.

B. Second Embodiment

FIGS. 7(A) and 7(B) are plan views schematically illustrating the structure of a main part of a projector PJ2 in a second embodiment. FIG. 7(A) shows the projector PJ2 seen from the Y direction, and FIG. 7(B) shows the projector PJ2 seen from the X direction. The same constituents as those of the projector PJ1 of the first embodiment are expressed by the same numerals and are not specifically described here.

The structure of the projector PJ2 in the second embodiment is similar to that of the projector PJ1 in the first embodiment, except that the integrator optical system 120 of FIG. 1 emitting non-polarized light is replaced by an integrator optical system 150 (hereinafter may also be referred to as 'polarization conversion optical system') that converts non-polarized light to substantially one type of polarized light and emits the polarized light. The integrator optical system 150 of this embodiment emits X polarized light.

The position of the polarizers in the liquid crystal light valve LV is changed with the replacement of the integrator optical system. More specifically, in the projector PJ2 of this embodiment, the structural birefringent polarizing plate 200 is disposed on the light outgoing side of the liquid crystal device 300, whereas the light absorbing polarizing plate 400 is disposed on the light incoming side. With the change in position of the polarizers, the light absorbing polarizing plate 400 is arranged to make its transmission axis coincident with the X direction. The structural birefringent polarizing plate 200 is arranged to make its periodic fine structure extend along the Y direction. The light absorbing polarizing plate 400 of this embodiment accordingly transmits the X polarized light, while the structural birefringent polarizing plate 200 transmits the Y polarized light.

The polarization conversion optical system 150 includes the first lens array 130, the second lens array 140, a polarization beam splitter array (hereinafter referred to as PBS array) 160, a selective retardation plate 170, and a superimposing lens 180. The PBS array 160 includes a plurality of glass members having the cross section of a quasi parallelogram. Polarization separation films and reflection films are alternately formed on the interfaces of the adjoining glass members.

The bundle of rays entering the first lens array 130 is divided into a plurality of partial bundles by the respective small lenses 131. Each partial bundle is divided by the PBS array 160 into two linearly polarized lights having perpendicular polarizing directions. The selective retardation plate 170 functions to align the polarizing directions of two linearly polarized lights. The polarized light (X polarized light) aligned to have substantially the same polarizing direction is emitted via the superimposing lens 180 and are superimposed on the liquid crystal device 300 via the parallelizing lens 190 in the same manner as the first embodiment.

Application of the polarization conversion optical system 150 equalizes the in-plane intensity distribution of illumination light entering the liquid crystal device 300, while ensuring emission of the illumination light having the substantially adjusted polarizing direction with little loss of light. Such a polarization conversion optical system 150 is described in detail in JAPANESE PATENT LAID-OPEN GAZETTE No. 8-304739.

In the projector PJ2 of this embodiment including the polarization conversion optical system 150, the polarizer 400 disposed on the light incoming side of the liquid crystal device 300 is utilized to enhance the degree of polarization of the incident light. The enhanced utilization efficiency of light by the polarization conversion optical system 150 raises the intensity of the light entering the polarizer 200 disposed on the light outgoing side of the liquid crystal device 300. Namely, the thermal load applied to the polarizer 400 disposed on the light incoming side of the liquid crystal device 300 is smaller than that in the first embodiment, while the thermal load applied to the polarizer 200 disposed on the light outgoing side is greater than that in the first embodiment. Because of this fact, in the projector PJ2 of this embodiment, the light absorbing polarizing plate 400 is disposed on the light incoming side of the liquid crystal device 300, and the structural birefringent polarizing plate 200 is disposed on the light outgoing side.

As described above, in the projector PJ2, the structural birefringent polarizing plate 200 that hardly absorbs light and has excellent light resistance and heat resistance is disposed on the light outgoing side of the liquid crystal device 300. Such arrangement desirably reduces the heat generation in the polarizer and thus maintains the characteristics of the polarizer over a long time period, even when the light entering the polarizer has a high intensity per unit area, due to application of the polarization conversion optical system 150. This actualizes a projector that stably displays high-contrast, bright images.

The structural birefringent polarizing plate 200 may be replaced by any of the structural birefringent polarizing plates 200A, 200B, and 200E shown in FIGS. 3 to 5. Such replacement further enhances the contrast of the displayed image. Any of the structural birefringent polarizing plates 200, 200A, 200B, and 200E may also be applied for the polarizer 400 disposed on the light incoming side of the liquid crystal device 300.

C. Third Embodiment

As discussed previously, in order to improve the polarization separation characteristics (more specifically, in order to reduce incident angle dependency and wavelength dependency), it is desirable to minimize the pitch of the periodic fine structure on the structural birefringent polarizing plate 200 to the smallest possible level relative to the wavelength of light. However, there is a manufactural limit to make the periodic structure finer. This embodiment takes into account the layout of the structural birefringent polarizing plate 200 and thereby compensates for the polarization separation characteristics of the structural birefringent polarizing plate 200.

FIG. 8 is a plan view schematically illustrating the structure of a main part of a projector PJ3 in a third embodiment. The structure of the projector PJ3 is similar to that of the projector PJ1 of the first embodiment, except that the structural birefringent polarizing plate 200 is inclined to the illumination optical axis L (that is, the center axis of light illuminating the liquid crystal device).

The inclination of the structural birefringent polarizing plate 200 to the illumination optical axis L virtually reduces the pitch of the fine periodic structure relative to the incident light along the illumination optical axis L. Such layout of the polarizing plate 200 improves the polarization separation characteristics of the polarizing plate 200, thus attaining a projector that stably displays high-contrast, bright images.

It is desirable that the structural birefringent polarizing plate 200 has a greater angle of inclination to the illumination optical axis L. The preferable setting for the angle of inclination is about 45 degrees, by taking into account the loss of light in the polarizing plate 200 and the treatment of the reflected light from the polarizing plate 200. In the case of such setting for the angle of inclination, the light reflected by the structural birefringent polarizing plate 200 is emitted in the direction of about 90 degrees relative to the illumination optical axis L. This reflected light has substantially no adverse effects on other optical elements.

Setting about 45 degrees to the angle of inclination of the structural birefringent polarizing plate 200 to the illumination optical axis L is equivalent to increasing the dimension of the polarizing plate 200 in the Z direction. A greater space is thus required to locate the structural birefringent polarizing plate 200 on the light incoming side of the liquid crystal device 300.

Figure 9A:
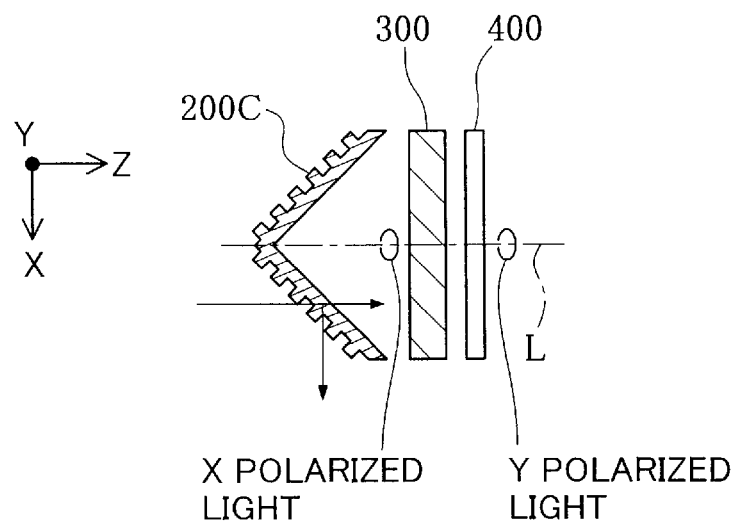
FIGS. 9(A) and 9(B) show modified examples of the structural birefringent polarizing plate of FIG. 8.
Figure 9B:
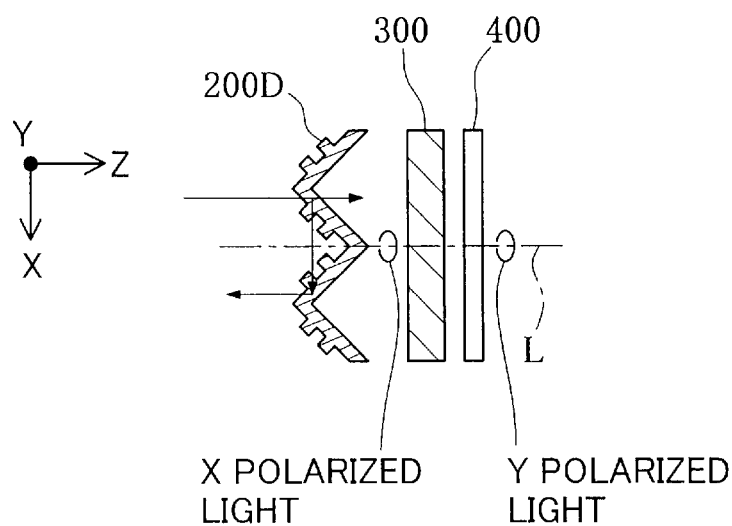

FIGS. 9(A) and 9(B) show modified examples of the structural birefringent polarizing plate of FIG. 8. FIG. 9(A) shows a structural birefringent polarizing plate 200C that is bent at one position along the Y axis to a V shape, and FIG. 9(B) shows a structural birefringent polarizing plate 200D that is bent at three positions to a W shape. The layout of dividing the structural birefringent polarizing plate 200 into a plurality of areas and arranging each area inclined to the illumination optical axis L decreases the dimension of the structural birefringent polarizing plate in the Z direction, thus relatively reducing the space required for the structural birefringent polarizing plate.

The structural birefringent polarizing plate 200C shown in FIG. 9(A) causes the reflected light to be emitted in the direction substantially perpendicular to the illumination optical axis L. The reflected light has substantially no adverse effects on other optical elements and is thus readily treated. Incidence of light from the light outgoing side often causes malfunction of the liquid crystal device. Because of the feature discussed above, the structural birefringent polarizing plate 200C may be applied for the polarizer disposed on the light outgoing side of the liquid crystal device. The structural birefringent polarizing plate 200D shown in FIG. 9(B), on the other hand, returns part of the reflected light to the light source device 110 (see FIG. 8) for recycling.

Either of the structural birefringent polarizing plates 200C and 200D may be arranged in an inverted orientation. For example, to change the light incoming surface to the light outgoing surface of the structural birefringent polarizing plate 200C shown in FIG. 9(A), one ridge line defined by two areas of the polarizing plate 200C may be faced to the liquid crystal device 300.

In both the examples of FIGS. 9(A) and 9(B), the plurality of areas in the structural birefringent polarizing plate are all inclined to the illumination optical axis L. Part of the areas may alternatively be arranged perpendicular to the illumination optical axis L. In general, at least one of the plurality of areas should be inclined to the illumination optical axis L.

In the examples of FIGS. 9(A) and 9(B), the display area of the liquid crystal device has a rectangular shape having longer sides in the X direction and shorter sides in the Y direction. As discussed above, the examples of FIGS. 9(A) and 9(B) use the structural birefringent polarizing plates 200C and 200D, which are respectively divided into a plurality of areas along the Y axis. It is, however, preferable to apply the structural birefringent polarizing plate divided into a plurality of areas along the X axis for the liquid crystal device having the rectangular display area. Namely it is desirable to divide the structural birefringent polarizing plate along the longer sides of the rectangular display area. The plurality of areas are then aligned along the shorter sides of the rectangular display area. Compared with the structural birefringent polarizing plates 200C and 200D of FIGS. 9(A) and 9(B), this arrangement relatively reduces the thickness of the structural birefringent polarizing plate in the Z direction.

D. Fourth Embodiment

FIG. 10 is a plan view schematically illustrating the structure of a main part of a projector PJ4 in a fourth embodiment. Like the projector PJ3 of the third embodiment, in this projector PJ4, the structural birefringent polarizing plate 200 is inclined to the illumination optical axis L. More specifically, the structural birefringent polarizing plate 200 is inclined at an angle of 45 degrees to the illumination optical axis L.

This layout of the structural birefringent polarizing plate 200 enables the projector PJ4 to utilize the Y polarized light reflected by the structural birefringent polarizing plate 200 as the illumination light.

The layout of the structural birefringent polarizing plate 200 shown in FIG. 10 enables an L-shaped layout of the projector PJ4. This relatively decreases the dimension of the casing, which covers over the projector, either in the X direction or in the Z direction, thus reducing the whole size of the projector. The decreased dimension in the Z direction is preferable for rear-type projectors, whereas the decreased dimension in the X direction is preferable for vertical-type projectors, in which the light source device 110 is located on the bottom.

E. Fifth Embodiment

In the case where the polarizer including the light reflective polarizing plate is disposed on the light outgoing side of the liquid crystal device, care must be taken in preventing a non-required polarized light reflected by the light reflective polarizing plate from entering the light outgoing surface of the liquid crystal device. This is because thin film transistors (TFT) often applied as active switching elements for the liquid crystal device may malfunction in response to light entering the light outgoing side of the liquid crystal device.

A polarization beam splitter having a polarization separation film has recently been applied for the polarizer including the light reflective polarizing plate (for example, JAPANESE PATENT LAID-OPEN GAZETTE No. 7-306405). The polarization beam splitter has two rectangular prisms and a polarization separation film formed on an interface of the two rectangular prisms. The polarization beam splitter is arranged to make its polarization separation film inclined at an angle of about 45 degrees to the illumination optical axis. Arrangement of such a polarization beam splitter on the light outgoing side of the liquid crystal device causes the light reflected by the polarization separation film to be emitted in a direction substantially perpendicular to the illumination optical axis, thus effectively preventing malfunction of the liquid crystal device.

However, the dimension of the polarization beam splitter along the illumination optical axis is set to be substantially equal to the dimension of the longer sides of the rectangular display area on the liquid crystal device. This undesirably increases the total size of the polarizer. A relatively large space is thus required to locate the polarizer on the light outgoing side of the liquid crystal device. This leads to an increase in size of the projector. The long distance between the liquid crystal device and the projection optical system requires a large-diametral projection lens, which raises the manufacturing cost of the projection optical system.

The embodiment discussed below locates a polarizer including a light reflective polarizing plate on the light outgoing side of the liquid crystal device, so as to improve the light resistance and heat resistance of the polarizer while reducing the total size of the polarizer, which includes the light reflective polarizing plate and a prism.

Figure 11:
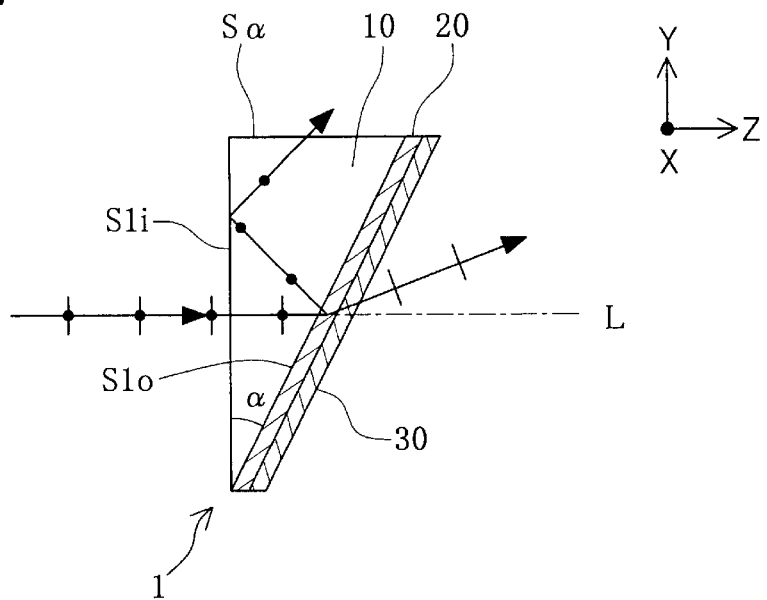
FIG. 11 is a sectional view schematically illustrating the structure of a first light reflective polarizer 1 in a fifth embodiment.

FIG. 11 is a sectional view schematically illustrating the structure of a first light reflective polarizer 1 in a fifth embodiment. The light reflective polarizer 1 includes a prism 10, a light reflective polarizing plate 20, and a light absorbing polarizing plate 30.

The prism 10 is a light transmissive body having a light incoming surface S1$i$ and a light outgoing surface S1$o$, which are not parallel to each other. More specifically, the prism is a glass columnar body having a quasi-triangular cross section, where an angle (vertical angle) $\alpha$ defined by the light incoming surface S1$i$ and the opposite light outgoing surface S1$o$ is set to a specific value. The vertical angle $\alpha$ will be discussed later.

The light reflective polarizing plate 20 is an optical element that divides non-polarized light into two different polarized lights having different polarizing directions with little light absorption. The light reflective polarizing plate 20 of this embodiment may be constructed by any one of the following optical elements:

(a) a polarization separation element consisting of dielectric multi-layered films;

(b) a structural birefringent polarizing plate having a periodical fine structure;

(c) a multi-layered polymer polarizing plate obtained by laminating layers of an organic material having anisotropy of refractive index (birefringence), such as a liquid crystal material (for example, DBEF manufactured by 3M Corp.);

(d) an optical element obtained by combining a circular polarization reflector (for example, cholesteric liquid crystal), which divides non-polarized light into a right-handed circularly polarized light and left-handed circularly polarized light, with a $\lambda/4$ retardation plate;

(e) an optical element that utilizes the Brewster angle to separate a reflected polarized light from a transmitted polarized light (for example, see SID'92 DIGEST p427); and (f) a hologram optical element utilizing hologram.

The light absorbing polarizing plate 30 absorbs one linearly polarized light out of two linearly polarized lights having perpendicular polarizing directions, while transmits the other linearly polarized light. The light absorbing polarizing plate 30 may be obtained by uniaxially orienting a film impregnated with iodine or a dye.

The light absorbing polarizing plate 30 is used, since the polarization separation characteristics of the light reflective polarizing plate 20 often have incident angle dependency. The divergent light or the convergent light entering the light reflective polarizing plate 20 is transmitted with the degree of polarization, which varies with a variation in incident angle. The light absorbing polarizing plate 30 disposed on the light outgoing side of the light reflective polarizing plate 20 enhances the degree of polarization of the transmitted light. The light absorbing polarizing plate 30 is arranged to make the direction of its transmission axis substantially coincident with the polarizing direction of the transmitted light. The light reflective polarizer 1 having the above structure thus emits the polarized light in a substantially one polarizing state, that is, with the high degree of polarization.

Non-polarized light entering the light incoming surface S1$i$ of the prism 10 along the illumination optical axis L is divided into two linearly polarized lights having perpendicular polarizing directions by the light reflective polarizing plate 20 formed on the light outgoing surface S1$o$. One linearly polarized light is transmitted through the light reflective polarizing plate 20 and further through the light absorbing polarizing plate 30 and is emitted. The other linearly polarized light (X polarized light) is reflected by the light reflective polarizing plate 20 and re-enters the prism 10. In this embodiment, the polarized light transmitted through the light reflective polarizing plate 20 may be referred to as the transmitted light, whereas the polarized light reflected by the light reflective polarizing plate 20 may be referred to as the reflected light.

The reflected light (the return light) re-entering the prism 10 is totally reflected by the light incoming surface S1$i$ and is emitted from a surface S$\alpha$ opposite to the vertical angle $\alpha$. Namely very little light is emitted from the light incoming surface S1$i$ to the outside of the prism 10.

Figure 12:
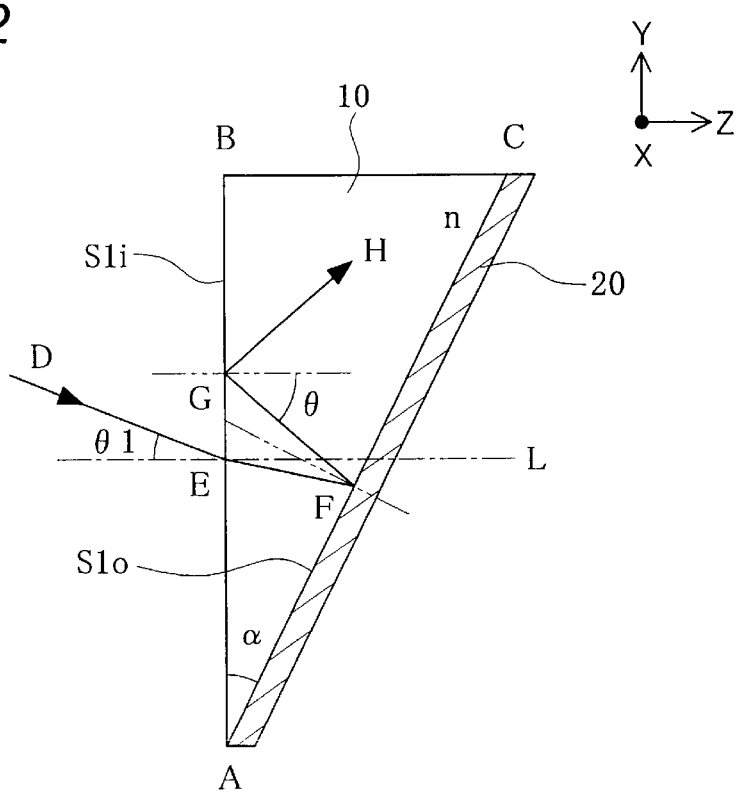
FIG. 12 shows setting for a vertical angle α of the prism 10.

FIG. 12 shows setting for the vertical angle $\alpha$ of the prism 10. The light entering the light incoming surface S1$i$ at an incident angle $\theta 1$ is reflected by the light reflective polarizing plate 20 and then enters the light incoming surface S1$i$ at an incident angle $\theta$. When the incident angle $\theta$ satisfies Relation (1) given below, the reflected light (the return light) is totally reflected by the light incoming surface S1$i$. The incident angle $\theta$ is specified by the incident angle $\theta 1$, the vertical angle $\alpha$ of the prism, and a refractive index n of the prism. When the vertical angle $\alpha$ satisfies Relation (2) given below, the return light is totally reflected by the light incoming surface S1$i$. Setting the vertical angle $\alpha$ in this manner effectively prevents the return light from being emitted from the light incoming surface S1$i$ to the outside of the prism 10.

$$\theta \leq \sin^{-1}(1/n) \tag{1}$$

$$\alpha \geq (\sin^{-1}(1/n \cdot \sin \theta 1) + \sin^{-1}(1/n))/2 \tag{2}$$

For example, when the maximum incident angle $\theta 1$ of the light entering the prism is ±11.3 degrees (this is equivalent to the case in which the F number of the integrator optical system of the projector is about 2.5) and the refractive index n of the prism is equal to 1.52, setting the vertical angle α of the prism to not lower than about 24.3 degrees causes the return light to be totally reflected by the light incoming surface S1i.

A dimension BC of the surface Sα opposite to the vertical angle α in the direction of the illumination optical axis L is set to be about 0.45 times a dimension AB of the light incoming surface S1i in the Y direction. The shorter dimension BC of the prism 10 than the dimension AB desirably reduces the total size of the light reflective polarizer 1.

It is desirable that a phase change, which affects the polarizing state of light, hardly arises inside the prism 10. An internal stress or an external stress is often produced to cause a phase change in the vicinity of the vertexes of the prism 10, due to its shape. In order to maintain the polarizing state of the light passing through the prism 10, the prism 10 of this embodiment is composed of a glass material having a relatively small photoelastic constant. By considering the sensitivity of the human eye, it is preferable that the photoelastic constant of the glass material is not higher than about 1 nm/cm/$10^5$ Pa. The prism composed of such a glass material decreases the degree of the possibly arising phase change and practically equalizes the in-plane distribution of the degree of polarization. Any plastic material having a relatively small photoelastic constant may replace the glass material.

The light reflective polarizer 1 shown in FIG. 11 includes the light reflective polarizing plate 20 with very little light absorption and accordingly has the improved light resistance and heat resistance. Even when the light entering the polarizer has a high intensity, the polarizer exerts the stable polarization separation characteristics. In the prism 10, the angle (vertical angle) defined by the light incoming surface S1i and the light outgoing surface S1o is set to cause the reflected light (the return light) from the light reflective polarizing plate 20 to be totally reflected by the light incoming surface S1i of the prism 10. This setting effectively prevents the non-required polarized light (the reflected light) from being emitted from the light incoming surface S1i to the outside. The arrangement of locating the light reflective polarizer on the light outgoing side of the liquid crystal device in the projector does not cause the light to enter the light outgoing surface of the liquid crystal device, thus effectively preventing malfunction of the liquid crystal device.

In this embodiment, the prism 10, the base member of the light reflective polarizing plate 20, and the base member of the light absorbing polarizing plate 30 have substantially identical refractive indexes. The optical integration of the prism 10, the light reflective polarizing plate 20, and the light absorbing polarizing plate 30 decreases the loss of light at each interface and facilitates handling of the light reflective polarizer 1. The optical integration also enhances the utilization efficiency of light in the polarizer 1 and reduces the return light into the prism 10. It should be noted that the light absorbing polarizing plate 30 may be omitted in the case where the polarized light (the transmitted light) emitted from the light reflective polarizing plate 20 has a high degree of polarization.

In the polarizer 1 shown in FIG. 11, antireflection coatings are formed n the light incoming surface S1i and the surface Sα. Such coatings enable the external light to mostly enter the light incoming surface S1i of the prism 1, while causing the light totally reflected by the light incoming surface S1i to be mostly emitted from the surface Sα of the prism 1. The antireflection coatings of different structures are formed on the light incoming surface S1i and the surface Sα according to the incident angle of light.

Figure 13:
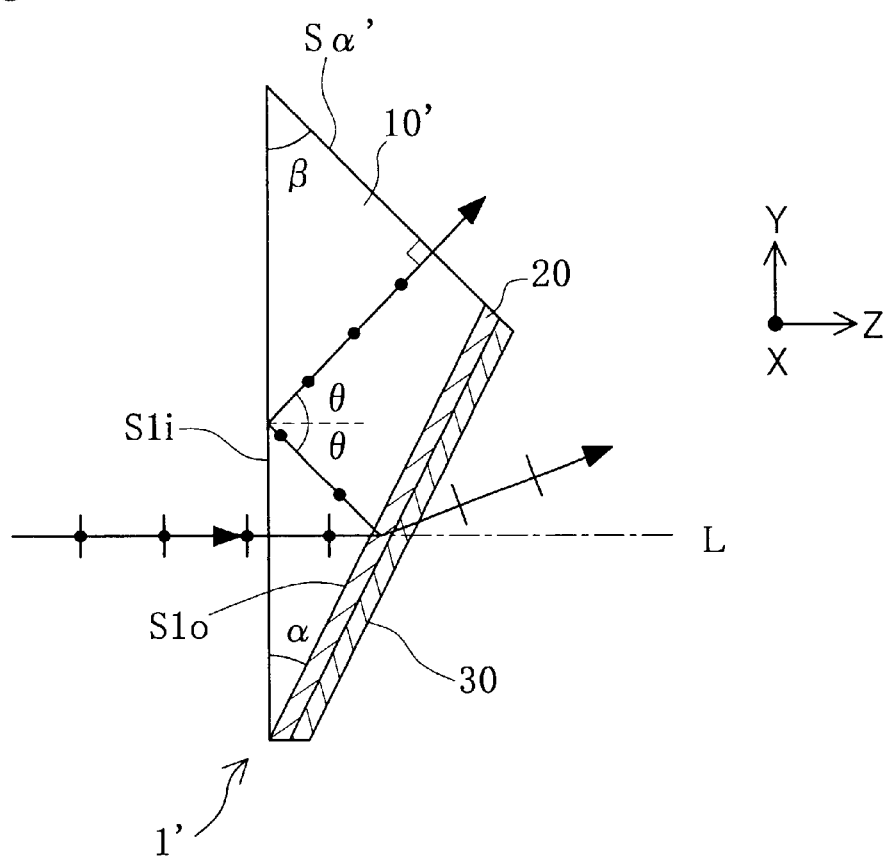
FIG. 13 shows a modified example of the polarizer 1 of FIG. 11.

In the actual state, however, the light entering the surface Sα of the prism 10 may be reflected by the surface Sα and re-enters the light reflective polarizing plate 20. FIG. 13 shows a modified example of the polarizer 1 of FIG. 11. A polarizer 1' shown in FIG. 13 has the structure similar to that of the polarizer 1 shown in FIG. 11, except the shape of a prism 10'. More specifically, the primary difference is a surface (opposite surface) Sα' opposite to the vertical angle α defined by the light incoming surface S1i and the light outgoing surface S1o of the prism 10'. The surface Sα' is set to cause the linearly polarized light (the X polarized light) totally reflected by the light incoming surface S1i of the prism 10' to enter the surface Sα' at virtually right angles. An angle β defined by the light incoming surface S1i and the surface Sα' is set substantially equal to the incident angle θ of the light, which has been reflected from the light reflective polarizing plate 20 and is to be totally reflected by the light incoming surface S1i.

Application of this polarizer 1' causes the light entering the surface Sα' to be mostly emitted from the surface Sα', thus significantly reducing the light re-entering the light reflective polarizing plate 20. In the polarizer 1', the incident angle (almost 0 degree) of the light entering the light incoming surface S1i is equal to the incident angle of the light entering the surface Sα'. The antireflection coatings formed on the two faces S1i and Sα' may accordingly have a common structure.

Figure 14:
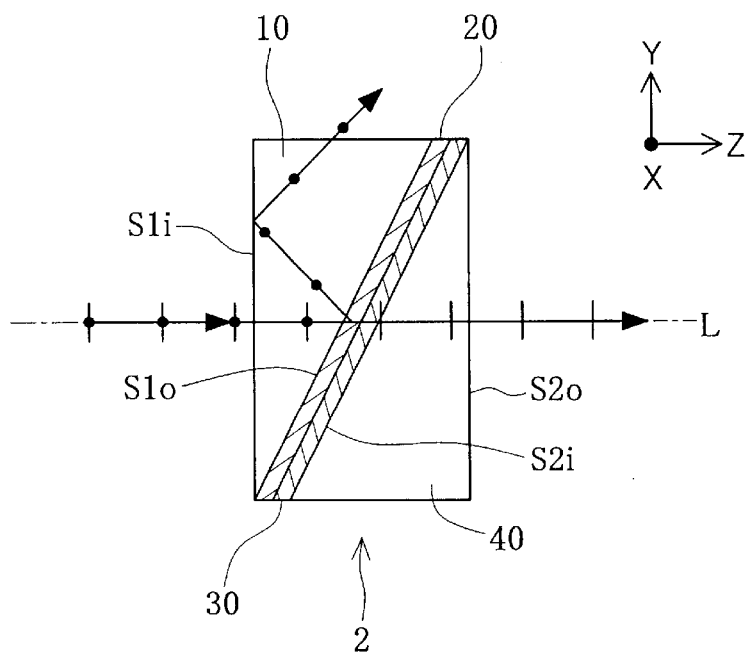
FIG. 14 is a sectional view schematically illustrating the structure of a second light reflective polarizer 2 in the fifth embodiment.

FIG. 14 is a sectional view schematically illustrating the structure of a second light reflective polarizer 2 in the fifth embodiment. The light reflective polarizer 2 has a similar structure to that of the light reflective polarizer 1 shown in FIG. 11, except that a second prism 40 is disposed on the light outgoing side of the light absorbing polarizing plate 30.

The light reflective polarizer 2 shown in FIG. 14 exerts the additional advantages discussed below, in addition to the same advantages as those of the light reflective polarizer 1 shown in FIG. 11.

In the example of FIG. 14, an identical prism is applied for the two prisms 10 and 40. The two prisms 10 and 40 are located inversely in the Y direction. The two prisms 10 and 40 have the same refractive index. The light outgoing surface S1o of the first prism 10 is substantially parallel to a light incoming surface S2i of the second prism 40. The light incoming surface S1i of the first prism 10 is substantially parallel to a light outgoing surface S2o of the second prism 40. Accordingly there is substantially no change in travelling direction of the light passing through the light reflective polarizer 2. Namely the travelling direction of the light entering the light reflective polarizer 2 is virtually coincident with the travelling direction of the light emitted from the light reflective polarizer 2. This arrangement advantageously facilitates the assembly of an optical system including the light reflective polarizer 2 in combination with another optical part.

The two prisms 10 and 40 may be composed of different materials. For example, materials having optimal physical properties (for example, refractive index and photoelastic constant) may be selected respectively for the prisms 10 and 40, according to the application of the light reflective polarizer 2. Even in the case where the two prisms 10 and 40 have different refractive indexes, adjustment of the vertical angle of the second prism makes the travelling direction of the light entering the light reflective polarizer substantially coincident with the travelling direction of the light emitted from the light reflective polarizer.

It should be noted that the materials having high refractive index and small photoelastic constant are expensive. In the arrangement of disposing the light reflective polarizers 2 on the light incoming side or on the light outgoing side of the liquid crystal device in the projector, the material having a high refractive index and a small photoelastic constant (for example, the material having a photoelastic constant of not higher than about 1 nm/cm/$10^5$ Pa) is applied for the prism closer to the liquid crystal device, while some inexpensive material may be applied for the other prism. This arrangement desirably reduces the manufacturing cost with little deterioration of the optical characteristics of the light reflective polarizer 2.

The second prism 40 is not required to cause total reflection. The travelling direction of the light emitted from the light reflective polarizer 2 is thus regulated by adequately setting the refractive index and the vertical angle of the second prism 40. This enhances the degree of freedom in layout of the other optical parts and facilitates the construction of, for example, an elevation angle projection optical system.

In this embodiment, the first prism 10, the base member of the light reflective polarizing plate 20, the base member of the light absorbing polarizing plate 30, and the second prism 40 have substantially identical' refractive indexes. The optical integration of the first prism 10, the light reflective polarizing plate 20, the light absorbing polarizing plate 30, and the second prism 40 decreases the loss of light at each interface and facilitates handling of the light reflective polarizer 2. The optical integration also enhances the utilization efficiency of light in the polarizer 2 and reduces the return light into the prism 10. It should be noted that the light absorbing polarizing plate 30 may be omitted as in the case of the light reflective polarizer 1.

Figure 15:
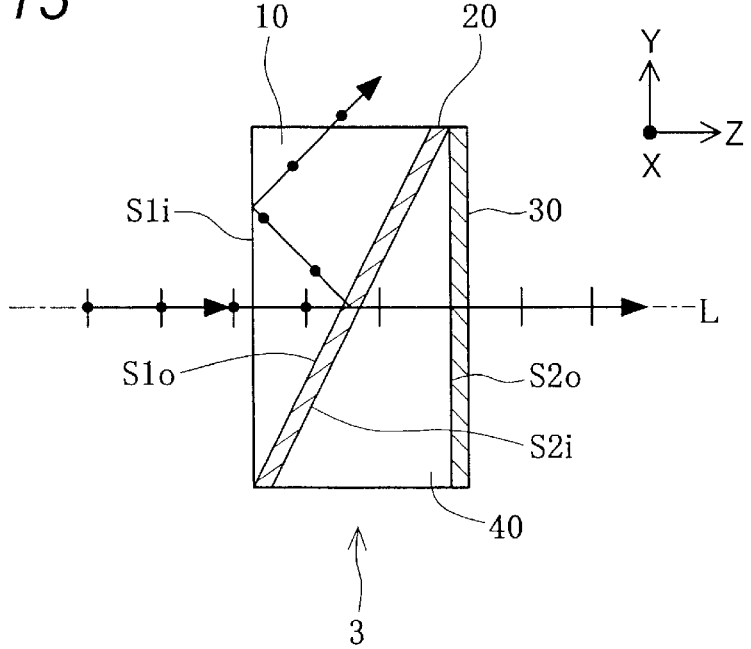
FIG. 15 is a sectional view schematically illustrating the structure of a third light reflective polarizer 3 in the fifth embodiment.

FIG. 15 is a sectional view schematically illustrating the structure of a third light reflective polarizer 3 in the fifth embodiment. In the light reflective polarizer 2 of FIG. 14, the light absorbing polarizing plate 30 is located on the light incoming surface S2*i* of the second prism 40. On the other hand, in the light reflective polarizer 3, the light absorbing polarizing plate 30 is located on the light outgoing surface S2*o* of the second prism 40. The light reflective polarizer 3 exerts the additional advantages discussed below, in addition to the same advantages as those of the light reflective polarizer 2 shown in FIG. 14.

The light absorbing polarizing plate 30 absorbs light and thereby generates heat. In the light reflective polarizer 2 shown in FIG. 14, the heat generated by the light absorbing polarizing plate 30 affects the second prism 40 and the light absorbing polarizing plate 30 itself to cause a phase change or deterioration of the polarization characteristics. On the other hand, in the light reflective polarizer 3 shown in FIG. 15, the heat generated by the light absorbing polarizing plate 30 is quickly released to the outside space. This arrangement thus desirably relieves the adverse effects of the heat generated by the light absorbing polarizing plate 30 on the peripheral optical elements, such as the second prism 40.

The arrangement of locating the light absorbing polarizing plate 30 on the light outgoing surface S2*o* of the second prism 40 enables the smaller incident angle of the transmitted light entering the light absorbing polarizing plate 30, thus advantageously improving the polarization characteristics of the light absorbing polarizing plate 30.

Figure 16:
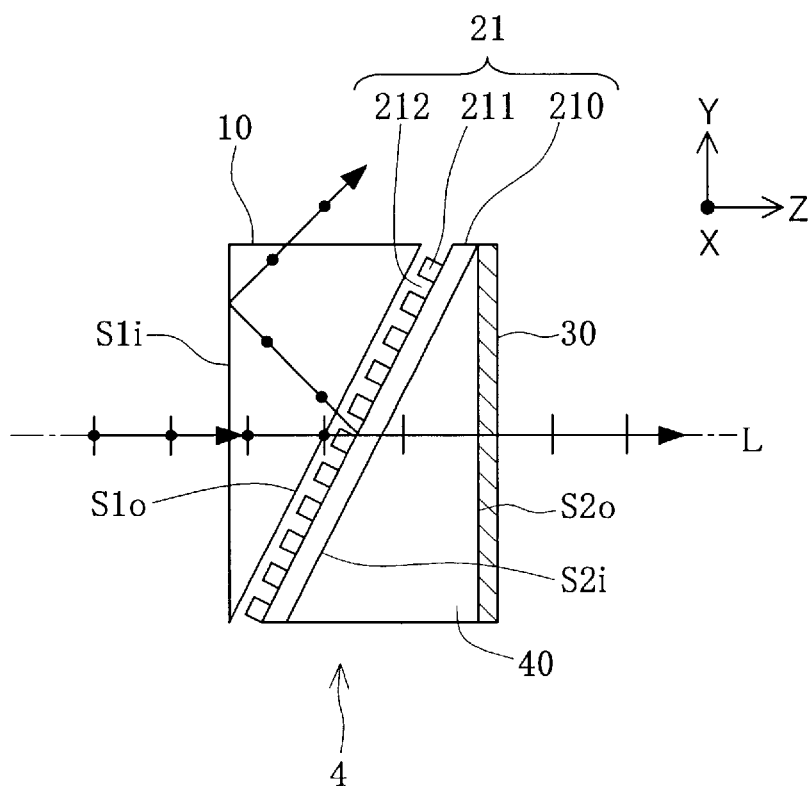
FIG. 16 is a sectional view schematically illustrating the structure of a fourth light reflective polarizer 4 in the fifth embodiment.

FIG. 16 is a sectional view schematically illustrating the structure of a fourth light reflective polarizer 4 in the fifth embodiment. The light reflective polarizer 4 has a similar structure to that of the light reflective polarizer 3 shown in FIG. 15, except that a structural birefringent polarizing plate 21 is applied for the light reflective polarizing plate 20. The structural birefringent polarizing plate 21 may be any of the structural birefringent polarizing plates discussed previously with FIGS. 2(A) and FIG. 2(B). The example of FIG. 16 uses the structural birefringent polarizing plate shown in FIG. 2(A).

The structural birefringent polarizing plate 21 has a light transmissive substrate 210, which is in close contact with the light incoming surface of the second prism 40, and a periodical fine structure (metal thin film) 211, which faces the first prism 10 across a small space. Light enters the fine periodic structure 211 across the small space and goes to the light transmissive substrate 210. Providing such a small space enhances the polarization separation characteristics of the structural birefringent polarizing plate 21.

The fine periodic structure 211 is periodically arranged in a specific direction that is perpendicular to the intersection line of the light incoming surface S1*i* and the light outgoing surface S1*o* of the first prism 10 (that is, the X direction) and is parallel to the light outgoing surface S1*o*. The grooves 212 extend in the X direction. The structural birefringent polarizing plate 21 is thus inclined to the illumination optical axis L. Such arrangement practically decreases the pitch of the fine periodic structure relative to the illumination light and thereby improves the optical characteristics of the structural birefringent polarizing plate.

In the oblique layout of the structural birefringent polarizing plate 21 to the illumination optical axis L, it is preferable that the direction of the periodical arrangement of the fine periodic structure 211 is inclined to the illumination optical axis L. The layout of the structural birefringent polarizing plate to make the periodical arrangement of the fine periodic structure perpendicular to the illumination optical axis L does not practically decrease the pitch of the fine periodic structure relative to the illumination light, thus having difficulties in improving the optical characteristics.

In the example of FIG. 16, the refractive index of the light transmissive substrate 210 is set practically equal to the refractive index of the second prism 40. This reduces the loss of light occurring at the interface between the structural birefringent polarizing plate 21 and the second prism 40.

The light reflective polarizer 4 shown in FIG. 16 exerts the similar advantages to those of the light reflective polarizer 3 shown in FIG. 15. In the example of FIG. 16, the structural birefringent polarizing plate 21 having relatively small incident angle dependency of the polarization separation characteristics is applied for the light reflective polarizing plate and accordingly ensures the excellent polarization separation characteristics even when light having a high intensity or light having a large incident angle enters the light reflective polarizer 4.

The structural birefringent polarizing plate 21 applied for the light reflective polarizing plate 20 shown in FIG. 15 may be replaced with a multi-layered polarizing plate, which is composed of thin films with anisotropy of refractive index. The multi-layered polarizing plate is obtained by alternately laminating the first films with birefringence and the second films without birefringence as discussed previously with FIG. 6.

Application of the multi-layered polarizing plate for the light reflective polarizing plate 20 exerts the similar advantages to those of the light reflective polarizer 3 shown in FIG. 15. The multi-layered polarizing plate has relatively small wavelength dependency of the polarization separation characteristics and thus ensures excellent polarization separation characteristics even when the incident light has a wide wavelength domain like the visible light.

The first prism 10 in any of the polarizers 2, 3, and 4 shown in FIGS. 14, 15, and 16 may be replaced by the prism 10' shown in FIG. 13.

Figure 17:
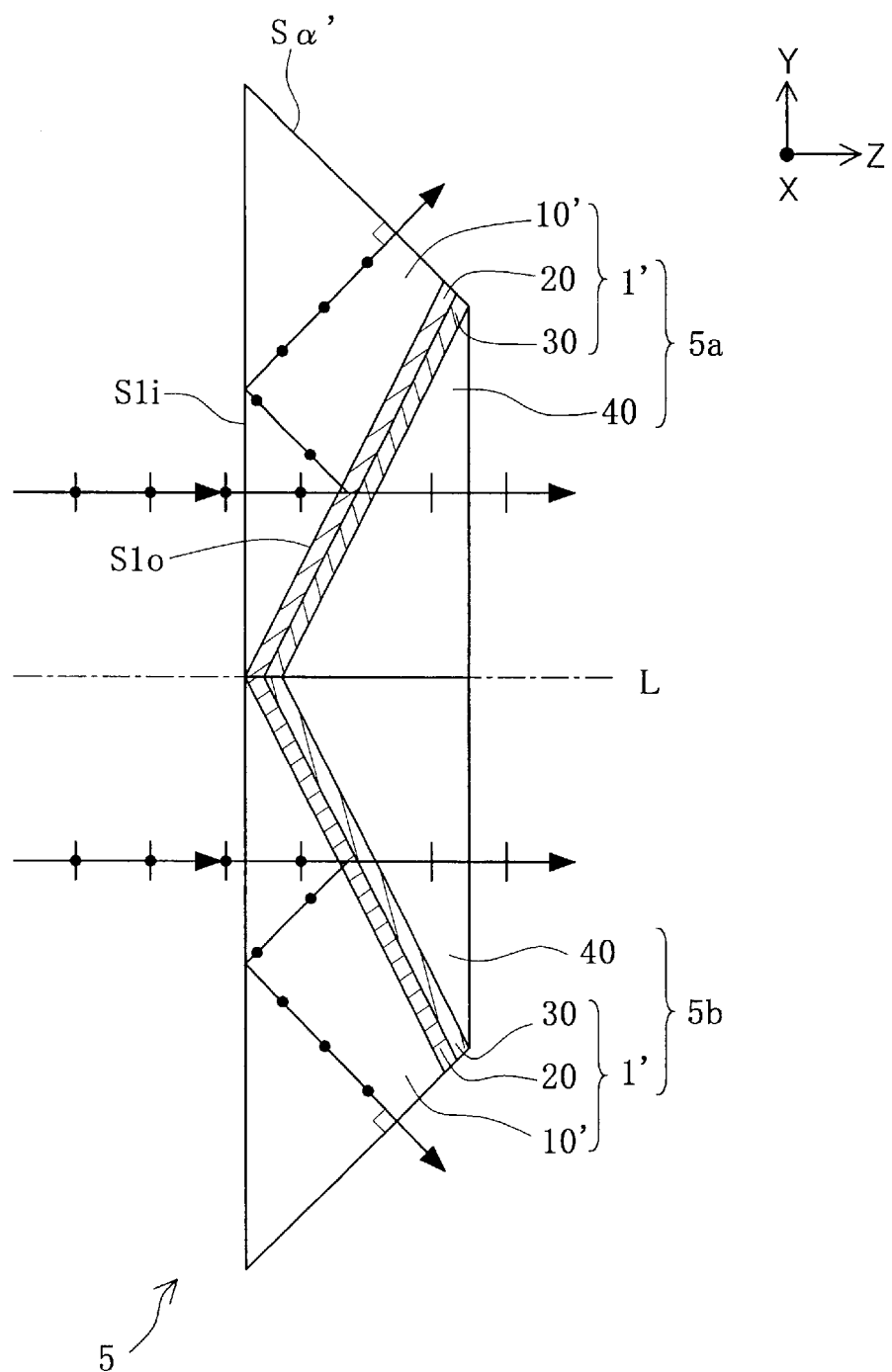
FIG. 17 is a sectional view schematically illustrating the structure of a fifth light reflective polarizer 5 in the fifth embodiment.

FIG. 17 is a sectional view schematically illustrating the structure of a fifth light reflective polarizer 5 in the fifth embodiment. This light reflective polarizer 5 has two polarizer elements 5a and 5b, where the second prism 40 is disposed on the light outgoing side of the polarizer 1' shown in FIG. 13. The two polarizer elements 5a and 5b are connected to each other, such that the light incoming surfaces S1*i* of the respective first prisms 10' are located in a substantially identical plane. The two polarizer elements 5a and 5b are arranged to be symmetrical across the illumination optical axis L. The light reflective polarizing plates 20 of the respective polarizer elements 5a and 5b form a V shape.

The light reflective polarizer 5 of the above construction has the decreased dimension in the Z direction as discussed in FIG. 9(A). This reduces the size of the light reflective polarizer, while advantageously making the smaller space sufficient for the light reflective polarizer 5. Application of this light reflective polarizer 5 for the projector desirably reduces the total size of the projector.

In the example of FIG. 17, the separate prisms are applied for the second prisms 40 disposed on the light outgoing side of the two polarizer elements 5a and 5b. One integral prism may alternatively be used for the second prisms 40.

In the light reflective polarizer 5 shown in FIG. 17, the polarizer 1' of FIG. 13 is used for the polarizer elements. Any of the other polarizers 1 to 4 may alternatively be applied for the polarizer elements. The light reflective polarizer 5 of FIG. 17 is obtained by combining the two polarizer elements 1'. In another example, combination of four polarizer elements selected among the polarizers 1 to 4 gives the light reflective polarizing plates 20 forming a W shape as shown in FIG. 9(B). This further reduces the size of the light reflective polarizer. Application of this light reflective polarizer further reduces the total size of the projector. In general, a plurality of polarizer elements are connected in such a manner that light incoming surfaces of respective first prisms are located in a substantially identical plane.

FIG. 18 is a plan view schematically illustrating the structure of a main part of a projector PJ5 in the fifth embodiment. The plan view of FIG. 18 is seen from the X direction.

The projector PJ5 has a similar structure to that of the projector PJ2 of the second embodiment (see FIG. 7(B)), except a polarizer disposed on the light outgoing side of the liquid crystal device 300. More specifically, the projector PJ5 uses a light reflective polarizer 3', in which the first prism 10 of the light reflective polarizer 3 shown in FIG. 15 is replaced by the first prism 10' shown in FIG. 13. In the projector PJ5, a superimposing lens 180' in a polarization conversion optical system 150' is oriented to make its convex surface function as the light incoming surface.

FIG. 19 shows layout of the light reflective polarizer 3' disposed on the light outgoing side of the liquid crystal device 300 of FIG. 18. The liquid crystal device 300 typically has a rectangular display area. The light reflective polarizer 3' is arranged to make an intersection line 11 defined by its light incoming surface S1*i* and light outgoing surface S1*o* substantially parallel to longer sides 301 of the display area of the liquid crystal device 300 (that is, the X direction).

Compared with the arrangement of making the intersection line 11 of the light incoming surface S1*i* and the light outgoing surface S1*o* substantially parallel to shorter sides of the display area of the liquid crystal device 300 (that is, the Y direction), this arrangement of the light reflective polarizer 3' shown in FIG. 19 relatively decreases the dimension of the light reflective polarizer 3' along the illumination optical axis L (that is, in the Z direction). As discussed previously with FIG. 12, the size of the light reflective polarizer 3' in the Z direction is determined as tanα times the dimension AB of the light incoming surface S1*i* of the first prism 10. The layout shown in FIGS. 18 and 19 shortens the distance between the liquid crystal device 300 and the projection optical system 500, thus desirably reducing the size of the projection lens and the whole projector while cutting the manufacturing cost.

As described above, application of the light reflective polarizer 3' having the improved light resistance and the heat resistance enables the projector PJ5 to generate polarized light having a high degree of polarization and displays high-contrast images. The light reflective polarizer 3' also prevents a non-required polarized light from returning to the liquid crystal device 300. This effectively prevents malfunction of the liquid crystal device 300 and ensures stable display of high-quality images, even when the light entering the polarizer has a high intensity.

In the projector PJ5, the light reflective polarizer 3' is located only on the light outgoing side of the liquid crystal device 300. The light reflective polarizer 3' may be disposed only on the light incoming side of the liquid crystal device 300 according to the presence or absence of the polarization conversion optical system 150', that is, according to the thermal load applied to the polarizer. More specifically, the light reflective polarizer 3' may be disposed at least on the light incoming side of the liquid crystal device 300 in the absence of the polarization conversion optical system 150' (in this case, the integrator optical system shown in FIG. 1 is adopted). In the presence of the polarization conversion optical system 150', on the other hand, the light reflective polarizer 3' may be disposed at least on the light outgoing side of the liquid crystal device 300. The light absorbing polarizing plate 400 may be used alone on the side without the light reflective polarizer 3'. Such arrangement attains the size reduction and the high performance of the projector, simultaneously with the reduction of the manufacturing cost.

The light reflective polarizer 3' used in the projector PJ5 may be replaced by any of the other light reflective polarizers 1, 1', 2, 3, 4, and 5.

The present invention is not restricted to the above embodiments or their modifications, but there may be many other modifications, changes, and alterations without departing from the scope or spirit of the main characteristics of the present invention. Some examples of possible modification are given below.

(1) In FIGS. 2(A), 2(B) and 16, the structural birefringent polarizing plate 200 or 21 is arranged to cause light to enter the surface with the fine periodic structure 211. The structural birefringent polarizing plate may alternatively be arranged to cause light to enter the surface opposite to the surface with the fine periodic structure 211, that is, the light transmissive substrate 210. The arrangement of FIGS. 2(A), 2(B) and 16, however, relatively enhances the polarization separation characteristics of the structural birefringent polarizing plate.

(2) The above embodiments regard the single-type projector using only one liquid crystal device. The principle of the present invention is also applicable to the projector using a plurality of liquid crystal devices. The transmissive-type liquid crystal device is used in the above embodiments. The present invention is also applicable to the projector using a reflective-type liquid crystal device. The technique of the present invention is further applicable to a rear projection-type projector that projects and displays images on a transmissive-type screen, as well as to the front projection-type projector.

INDUSTRIAL APPLICABILITY

The present invention is applicable to diverse optical devices utilizing polarizers, for example, projectors.

What is claimed is:

1. A projector, comprising:
    a light source device;
    an electro-optic device that modulates light emitted from the light source device;
    two polarizers that are disposed respectively on a light incoming side and a light outgoing side of the electro-optic device; and
    a projection optical system that projects light output from the electro-optic device,
    at least one of the two polarizers comprising:
        a first prism having a light incoming surface and a light outgoing surface, which face to each other in a non-parallel orientation; and
        a light reflective polarizing plate that is disposed on a side of the light outgoing surface of the first prism,
    wherein the light reflective polarizing plate divides light emitted from the first prism into first and second polarized lights having different polarizing directions, and transmits the first polarized light while reflecting the second polarized light, and
    an angle defined by the light incoming surface and the light outgoing surface of the first prism is set to cause the second polarized light, which has been reflected by the light reflective polarizing plate and returned to the first prism, to be totally reflected by the light incoming surface.

2. The projector in accordance with claim 1, wherein the first prism has an intersection line defined by the light incoming surface and the light outgoing surface, the intersection line being substantially parallel to longer sides of a rectangular display area on the electro-optic device.

3. The projector in accordance with claim 1, wherein a face of the first prism opposite to a vertical angle defined by the light incoming surface and the light outgoing surface of the first prism is set to cause the second polarized light totally reflected by the light incoming surface to enter the opposite face at substantially right angles.

4. The projector in accordance with claim 1, wherein the first prism is composed of a material having a photoelastic constant of not higher than about 1 nm/cm/$10^5$ Pa.

5. The projector in accordance with claim 1, further comprising a second prism, which is disposed on a light outgoing side of the light reflective polarizing plate to receive the first polarized light transmitted through the light reflective polarizing plate.

6. The projector in accordance with claim 5, wherein at least one of the first prism and the second prism is composed of a material having a photoelastic constant of not higher than about 1 nm/cm/$10^5$ Pa.

7. The projector in accordance with claim 5, wherein the second prism is arranged to make a travelling direction of the first polarized light emitted via the second prism substantially coincide with a travelling direction of light entering the first prism.

8. The projector in accordance with claim 1, wherein a light absorbing polarizing plate is disposed on a light outgoing side of the light reflective polarizing plate.

9. The projector in accordance with claim 1, wherein the light reflective polarizing plate is a structural birefringent polarizing plate.

10. The projector in accordance with claim 9, wherein the structural birefringent polarizing plate comprises a fine periodic structure periodically formed along a predetermined direction, and the predetermined direction is substantially perpendicular to an intersection line defined by the light incoming surface and the light outgoing surface of the first prism.

11. The projector in accordance with claim 1, wherein the light reflective polarizing plate is a multi-layered polarizing plate that is obtained by alternatively laminating a birefringent film and non-birefringent film.

12. A projector, comprising:
    a light source device;
    an electro-optic device that modulates light emitted from the light source device;
    two polarizers that are disposed respectively on a light incoming side and a light outgoing side of the electro-optic device; and
    a projection optical system that projects light output from the electro-optic device,
    at least one of the two polarizers including a plurality of polarizer elements, each polarizer element comprising:
        a first prism having a light incoming surface and a light outgoing surface, which face to each other in a non-parallel orientation; and
        a light reflective polarizing plate that is disposed on a side of the light outgoing surface of the first prism,
    wherein the plurality of polarizer elements are jointed in such a manner that the respective light incoming surfaces of the first prisms are located in a virtually same plane,
    wherein in the each polarizer element,
        the light reflective polarizing plate divides light emitted from the first prism into first and second polarized lights having different polarizing directions, and transmitting the first polarized light while reflecting the second polarized light, and
        an angle defined by the light incoming surface and the light outgoing surface of the first prism is set to cause the second polarized light, which has been reflected by the light reflective polarizing plate and returned to the first prism, to be totally reflected by the light incoming surface.

13. A polarizer comprising a plurality of polarizer elements, each polarizer element comprising:
    a first prism having a light incoming surface and a light outgoing surface, which face to each other in a non-parallel orientation; and
    a light reflective polarizing plate that is disposed on a side of the light outgoing surface of the first prism,
    wherein the plurality of polarizer elements are jointed in such a manner that the respective light incoming surfaces of the first prisms are located in a virtually same plane,
    wherein in the each polarizer element,
        the light reflective polarizing plate divides light emitted from the first prism into first and second polarized lights having different polarizing directions, and transmitting the first polarized light while reflecting the second polarized light, and
        an angle defined by the light incoming surface and the light outgoing surface of the first prism is set to cause the second polarized light, which has been reflected by the light reflective polarizing plate and returned to the first prism, to be totally reflected by the light incoming surface.

* * * * *